US006621134B1

(12) United States Patent
Zurn

(10) Patent No.: US 6,621,134 B1
(45) Date of Patent: Sep. 16, 2003

(54) VACUUM SEALED RF/MICROWAVE MICRORESONATOR

(76) Inventor: Shayne Zurn, 9955 Elm Creek Trail, Champlin, MN (US) 55316

( * ) Notice: Subject to any disclaimer, the term of this patent is extended or adjusted under 35 U.S.C. 154(b) by 0 days.

(21) Appl. No.: 10/067,299

(22) Filed: Feb. 7, 2002

(51) Int. Cl.$^7$ ............... H01L 29/82; H03H 9/00; H03H 9/205
(52) U.S. Cl. ............... 257/415; 438/32; 333/186; 333/197
(58) Field of Search ............... 257/415, 414; 438/32; 333/186, 197

(56) References Cited

U.S. PATENT DOCUMENTS

| | | | |
|---|---|---|---|
| 6,087,701 A | * | 7/2000 | Bergstrom et al. ........ 257/414 |
| 6,238,946 B1 | | 5/2001 | Ziegler |
| 6,262,464 B1 | | 7/2001 | Chan et al. |
| 6,275,122 B1 | | 8/2001 | Speidell et al. |

OTHER PUBLICATIONS

C. T.–C. Nguyen, "Microelectromechanical devices for wireless communications (invited)," Proceedings, 1998 IEEE International Micro Electro Mechanical Systems Workshop, Heidelberg, Germany, Jan. 25–29, 1998, pp. 1–7.

C.T.–C. Nguyen, "Communications applications of microelectromechanical systems," to be published in the Proceedings of the 1998 Sensors Expo, San Jose, CA, May 19–21, 1998, 9 pages.

C.T.–C. Nguyen, "Frequency–selective MEMS for miniaturized communication device (invited)," Proceedings, 1998 IEEE Aerospace Conference, vol. 1, Snowmass, Colorado, Mar. 21–28, 1998, pp. 445–460.

"High–Q HF Microelectromechanical Filters", Frank D. Bannon, III, Student Member, IEEE, John R. Clark, Student Member, IEEE, and Clark T.–C. Nguyen, Member IEEE, *IEEE Journal of Solid–State Circuits*, vol. 35, No. 4, Apr. 2000.

* cited by examiner

Primary Examiner—Wael Fahmy
Assistant Examiner—Howard Weiss
(74) Attorney, Agent, or Firm—Fitch, Even, Tabin & Flannery

(57) ABSTRACT

An electromechanical structure such as a MEMS resonator formed in the surface of a semiconductor body. A flexible beam containing a conductive plate is integrally formed in a cavity in the surface of a semiconductor body. A second conductive plate is parallel to the first along a sidewall of the cavity. A voltage applied across the first and second conductive plates forces the flexible beam to vibrate horizontally. A cap layer seals the cavity and maintains a vacuum in the cavity. The structure is smaller than the wavelength of the RF signal generated therefrom and, therefore, virtually shielded.

32 Claims, 14 Drawing Sheets

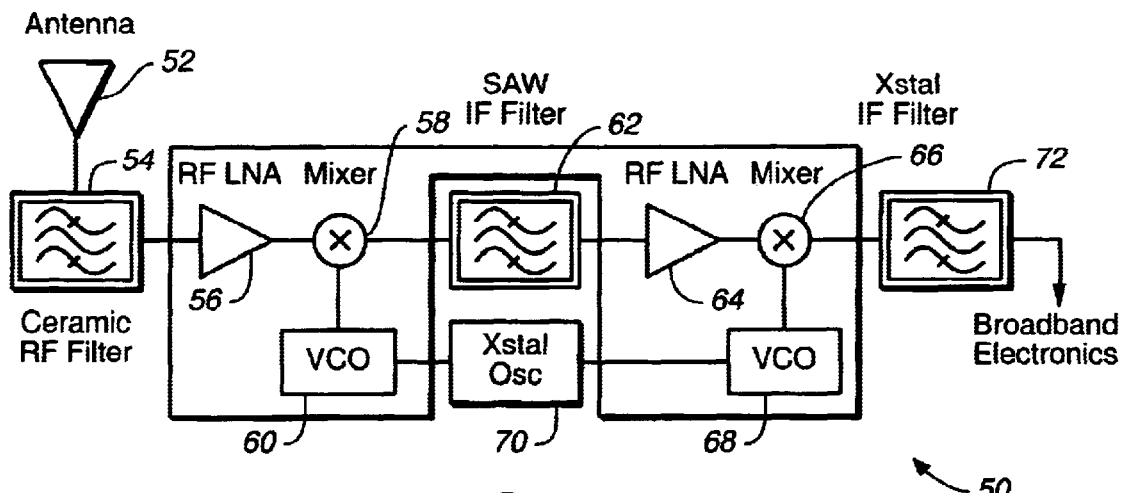
FIG._1
*(PRIOR ART)*
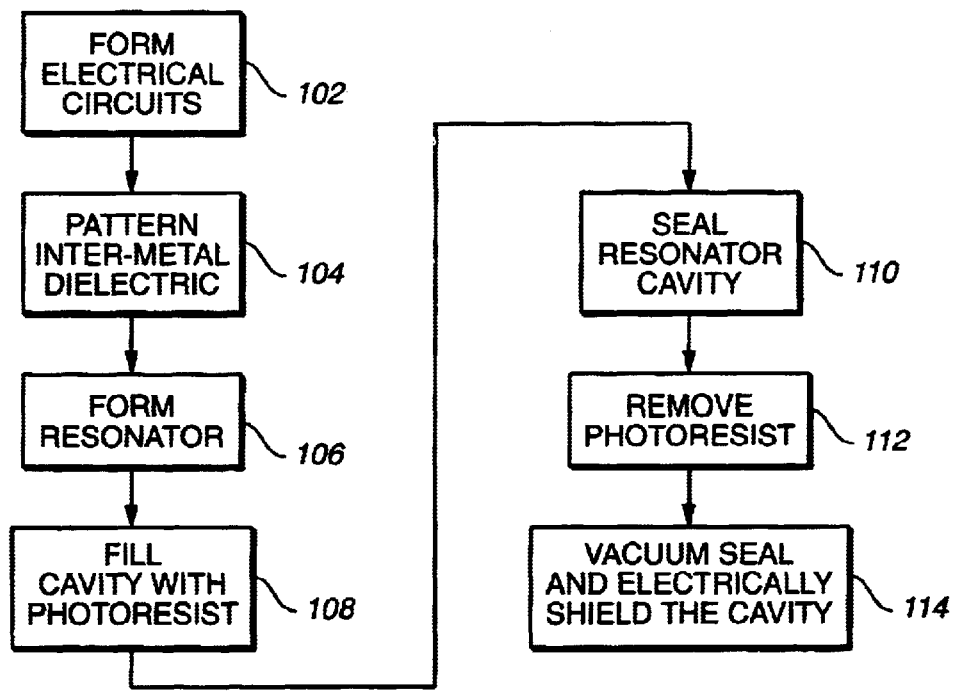
FIG._2

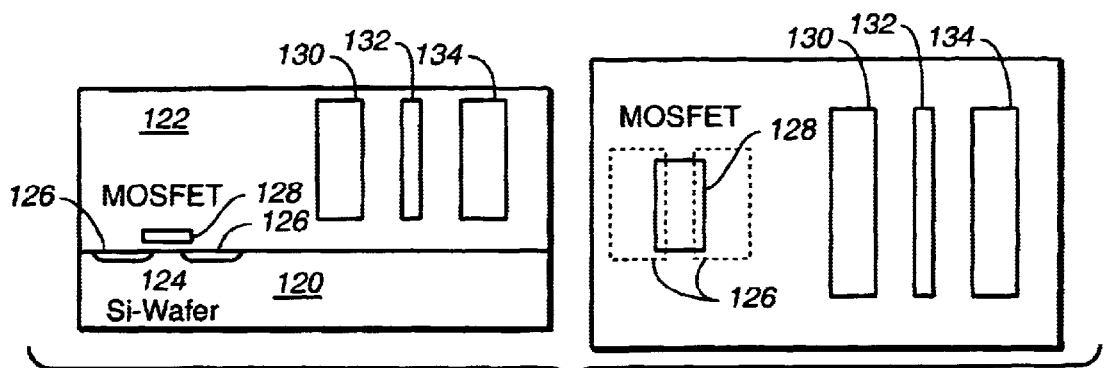
FIG._3A
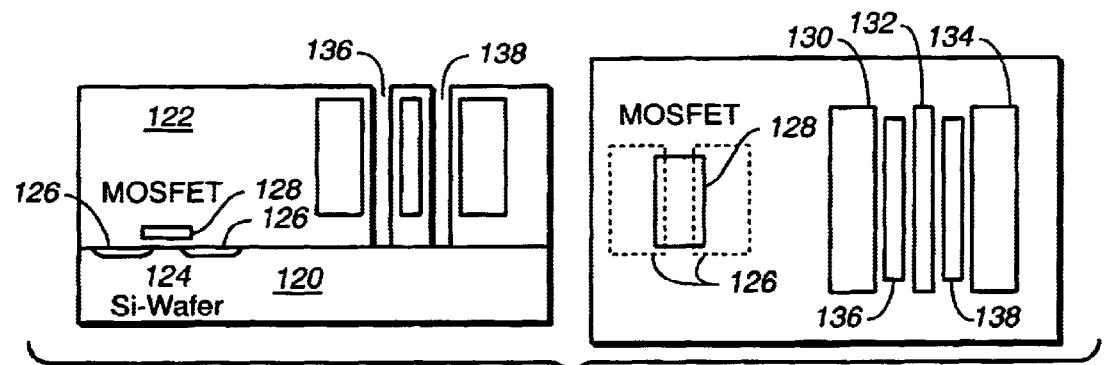
FIG._3B
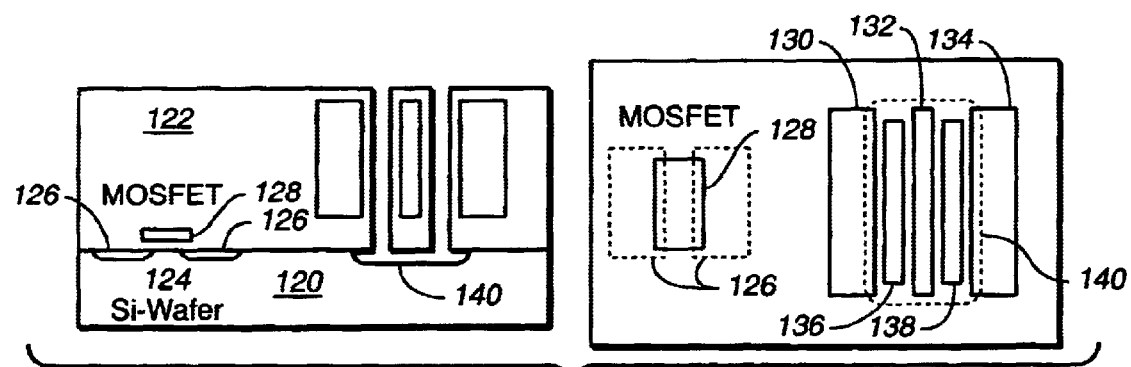
FIG._3C
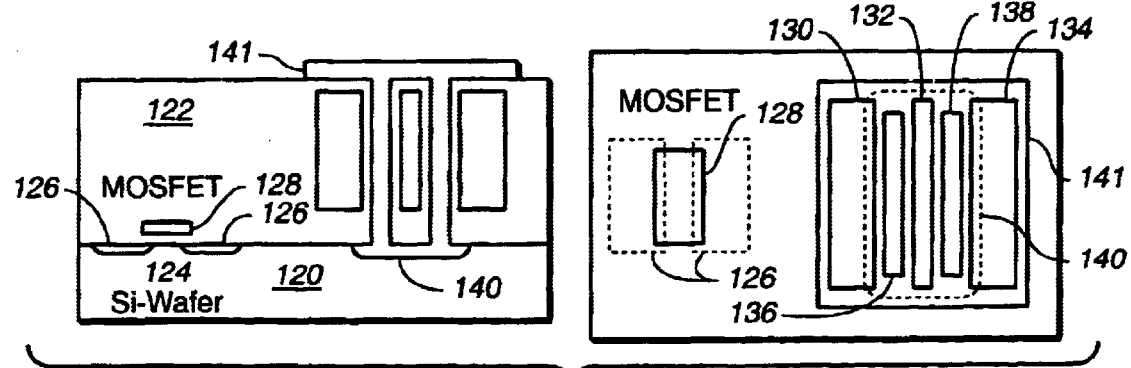
FIG._3D

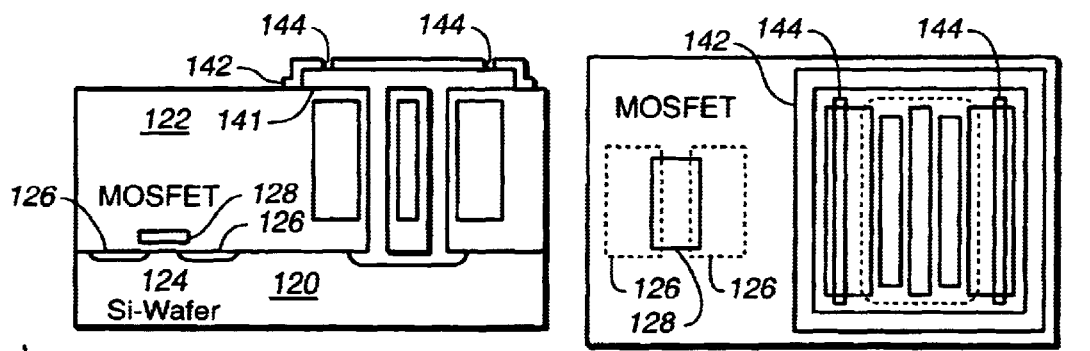
FIG._3E
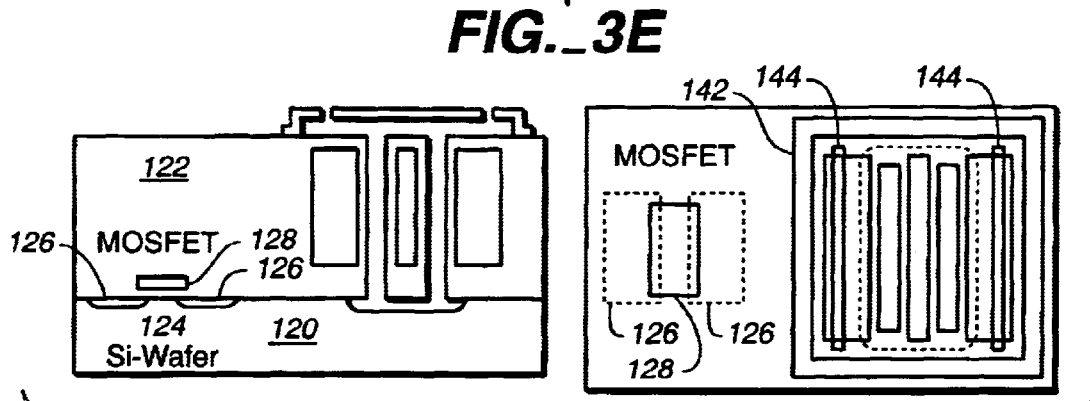
FIG._3F
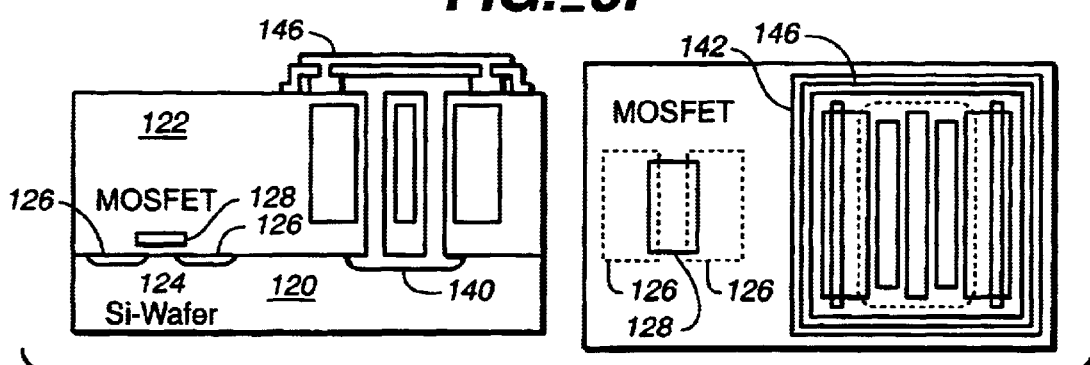
FIG._3G
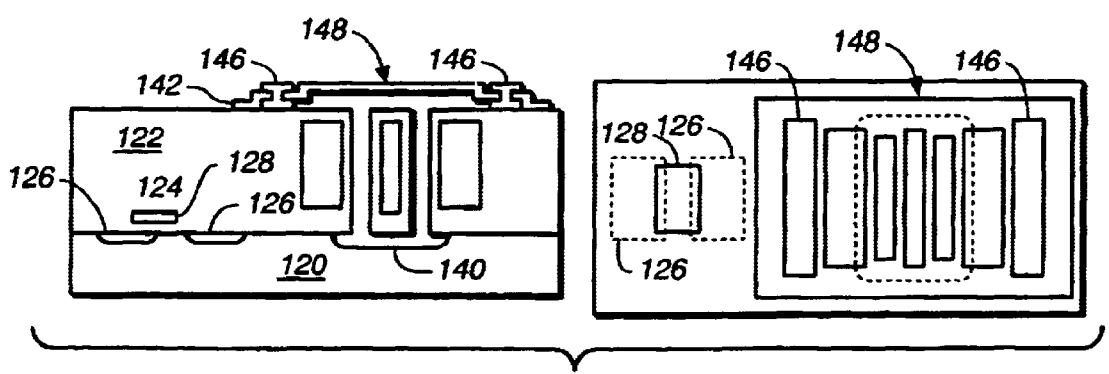
FIG._3H

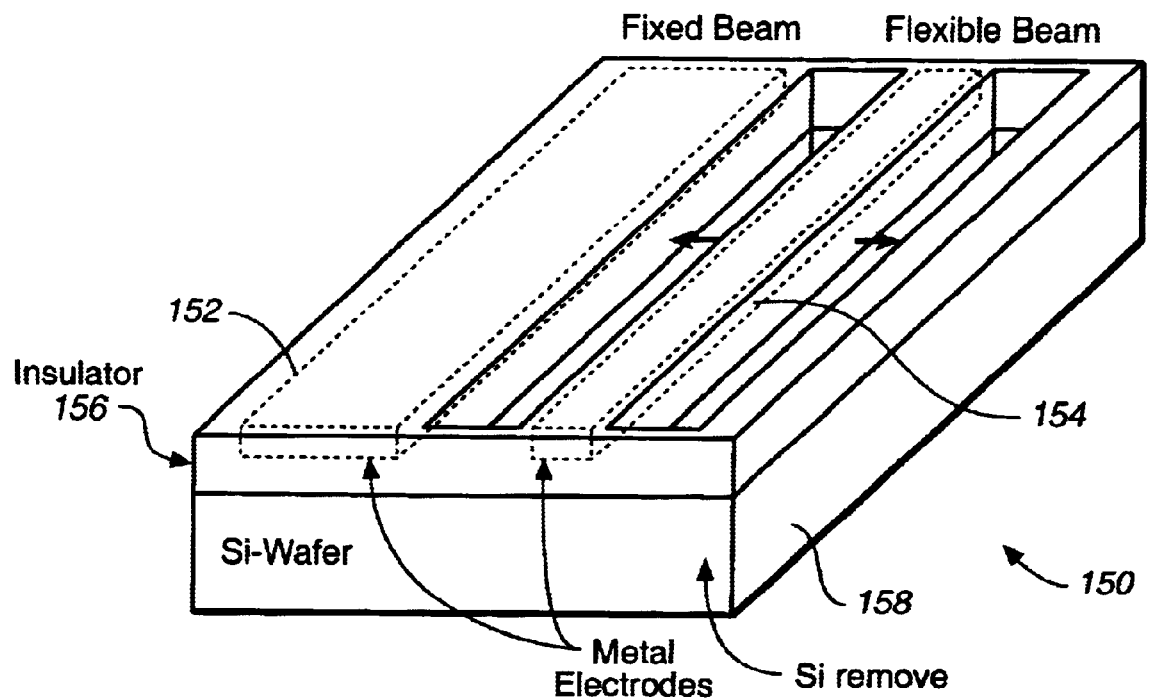
FIG._4A
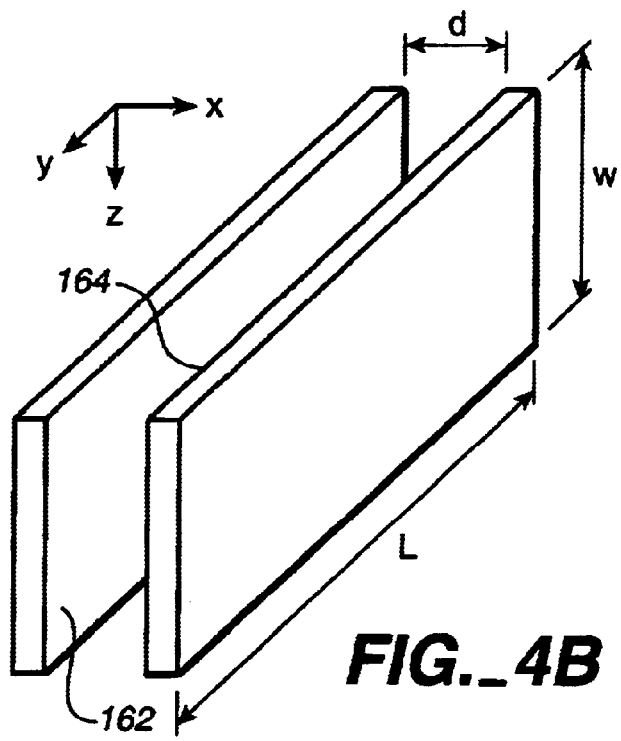
FIG._4B

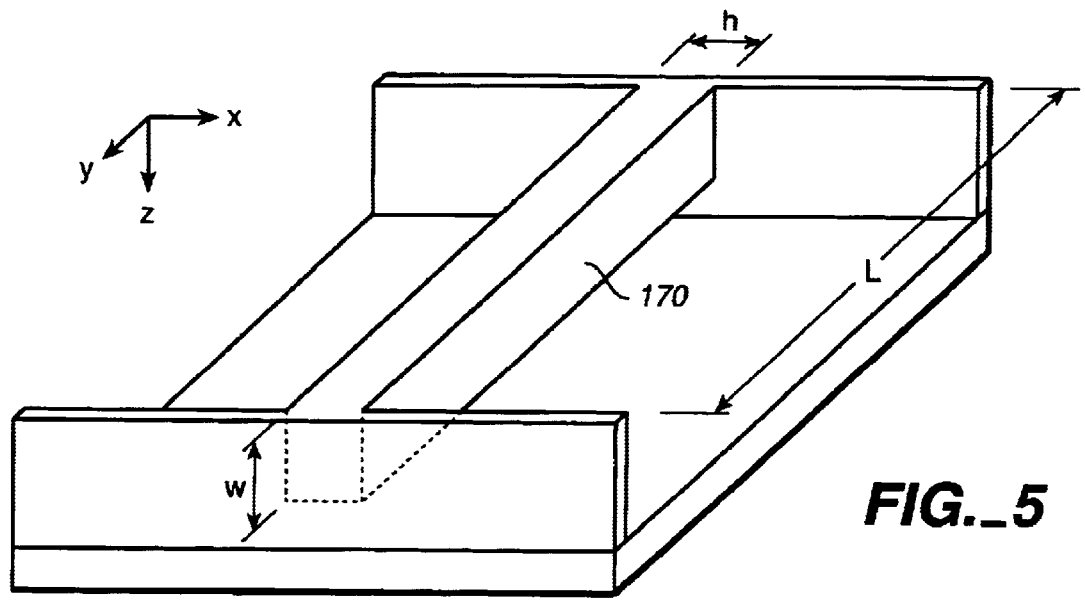
FIG._5
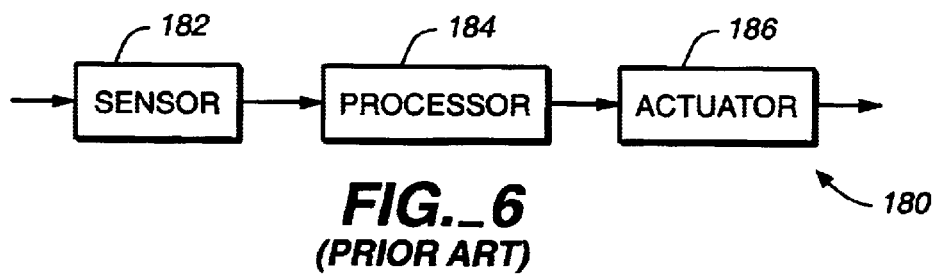
FIG._6
*(PRIOR ART)*
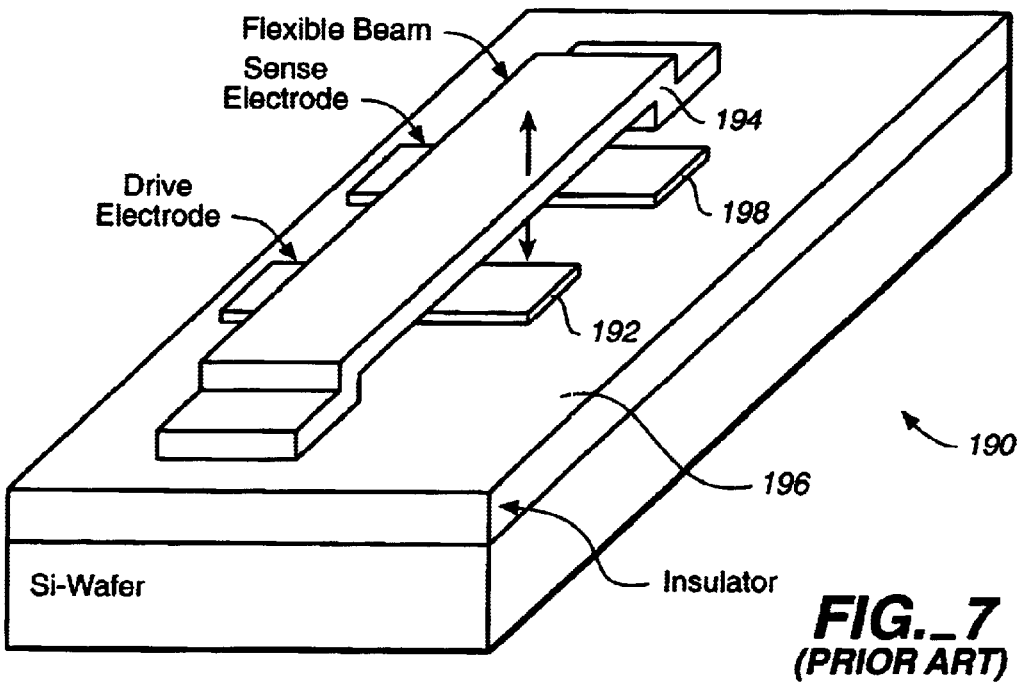
FIG._7
*(PRIOR ART)*

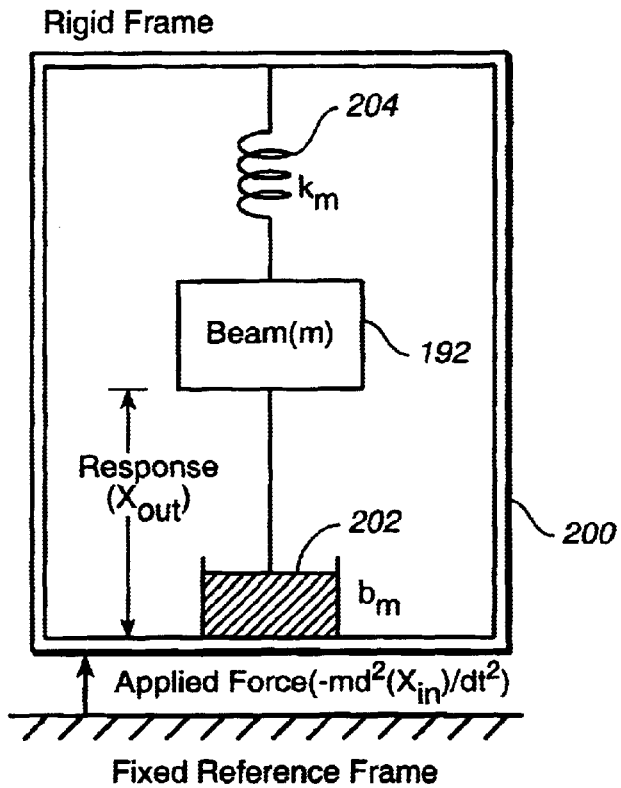
FIG._8
(PRIOR ART)
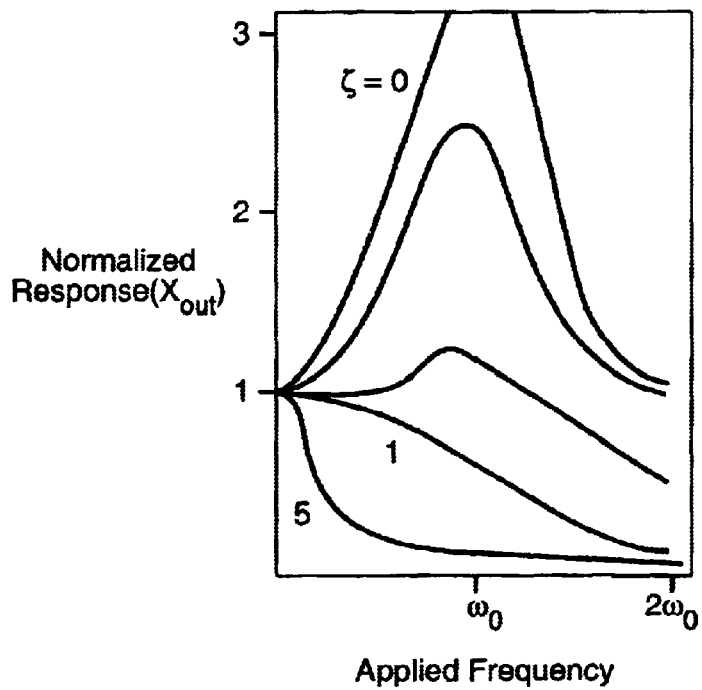
FIG._9
(PRIOR ART)

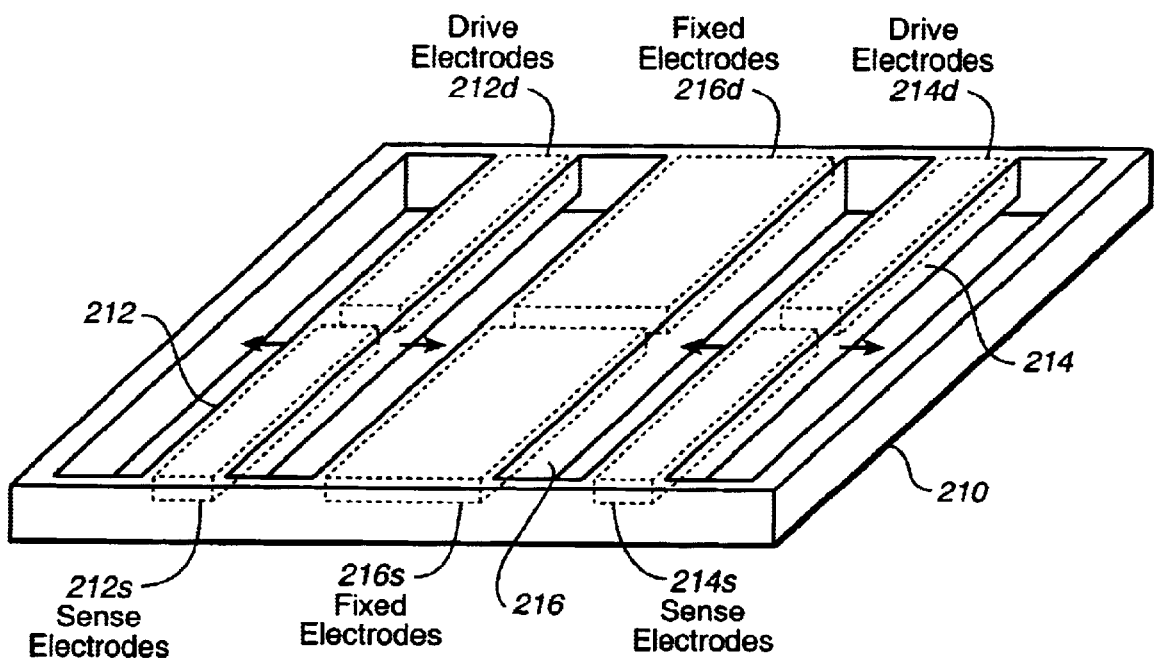
FIG._10
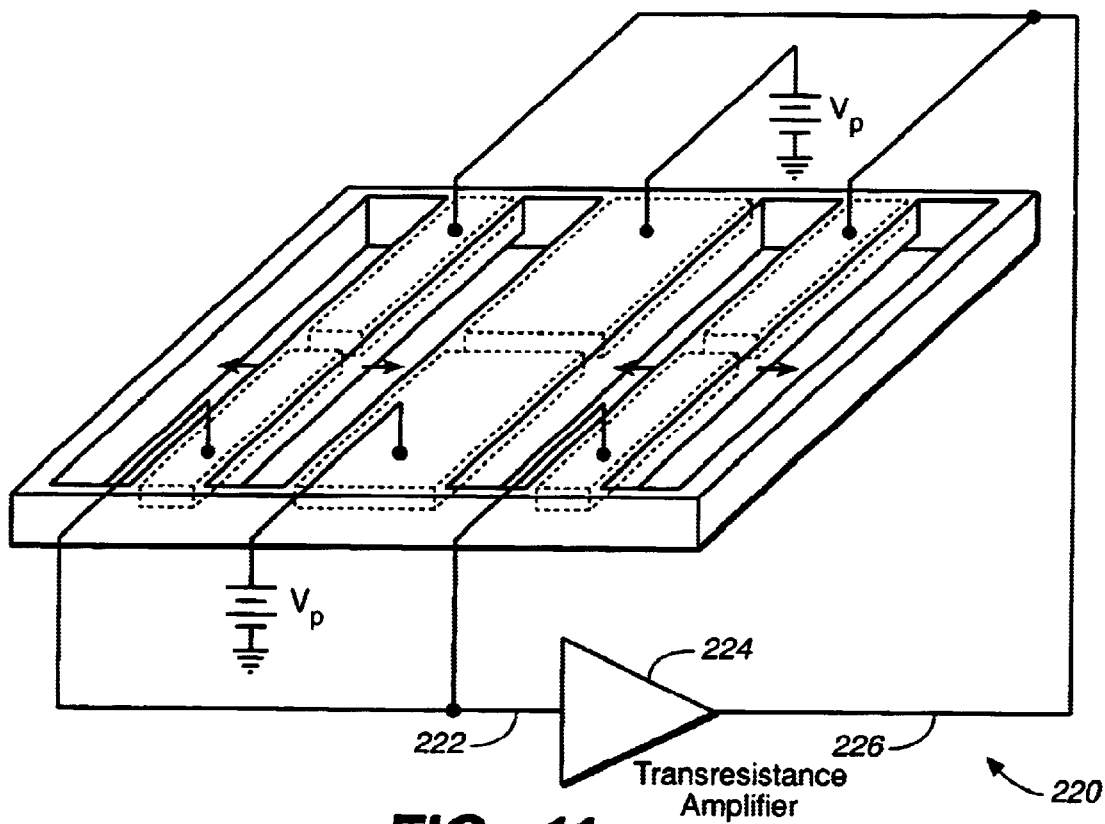
FIG._11

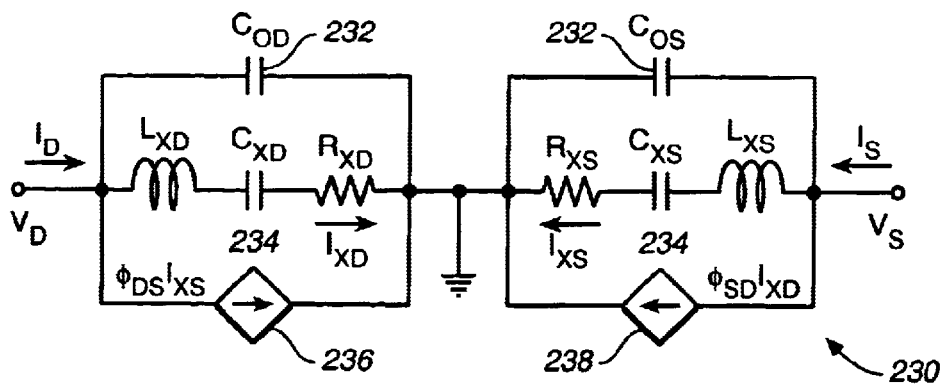
FIG._12
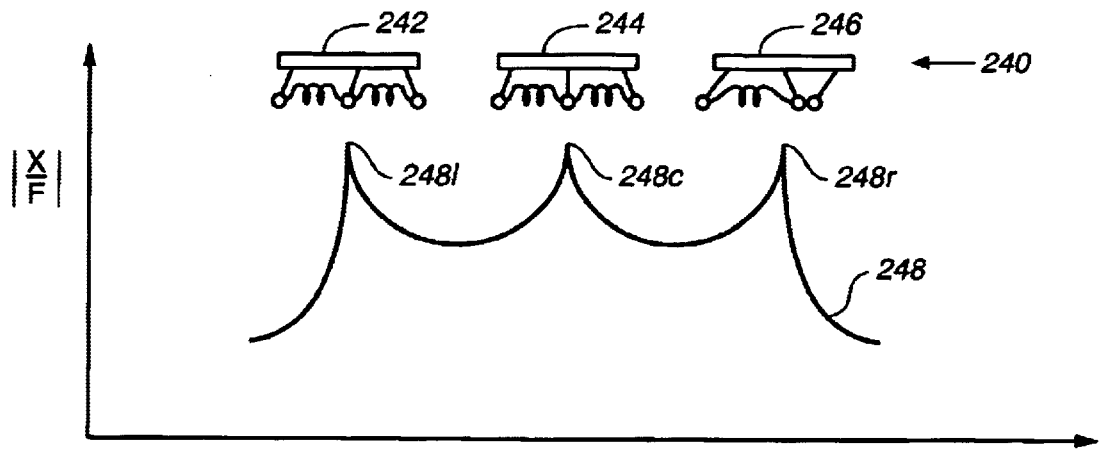
FIG._13
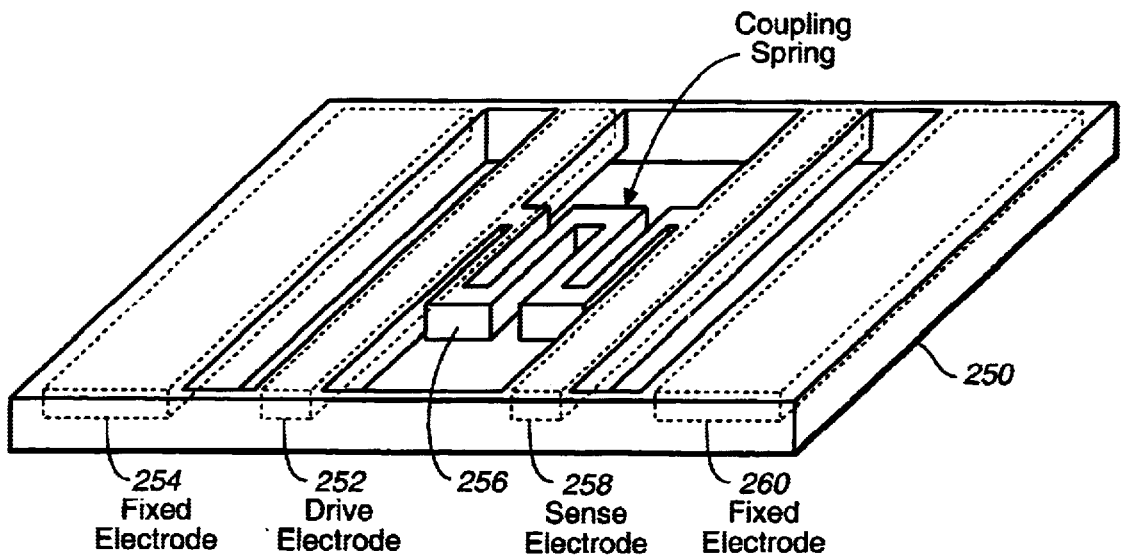
FIG._14

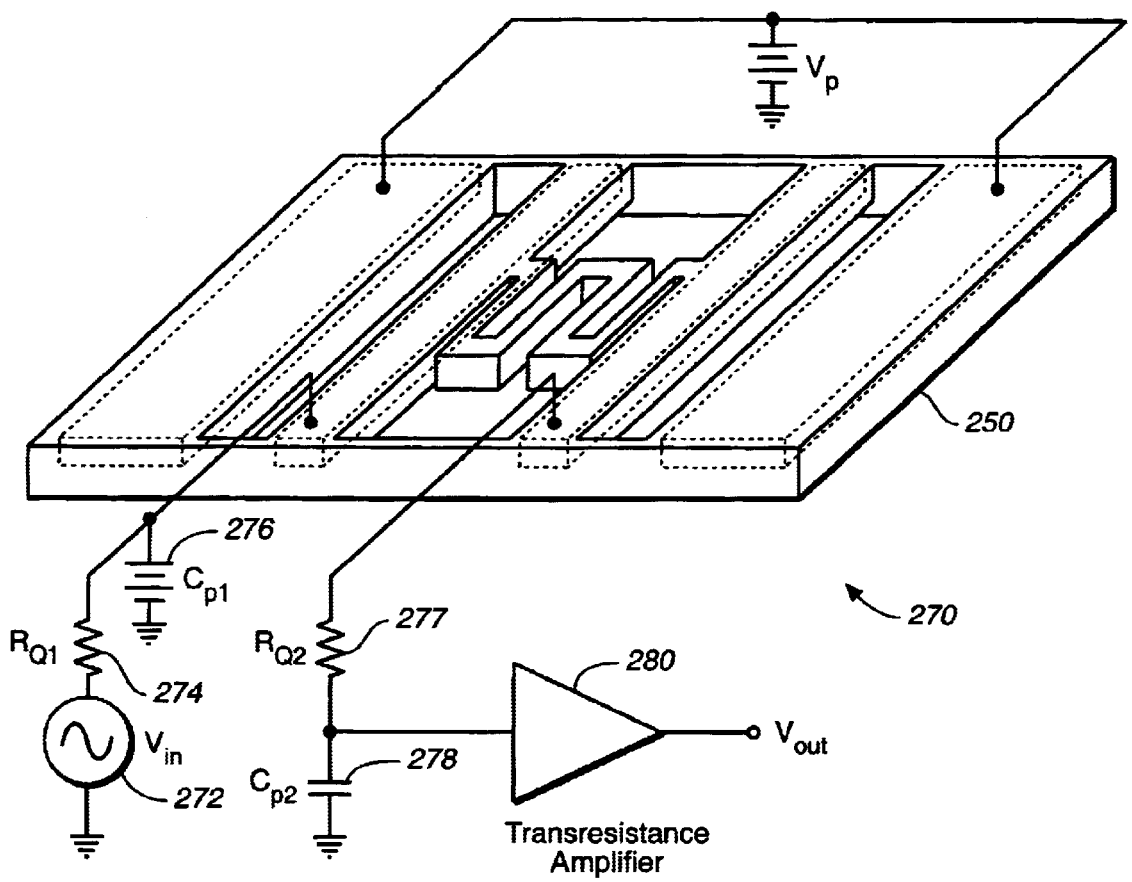
FIG._15
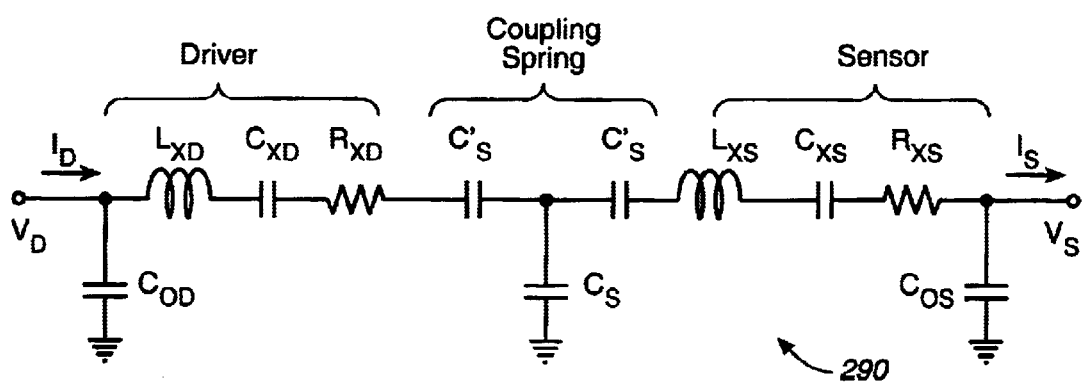
FIG._16

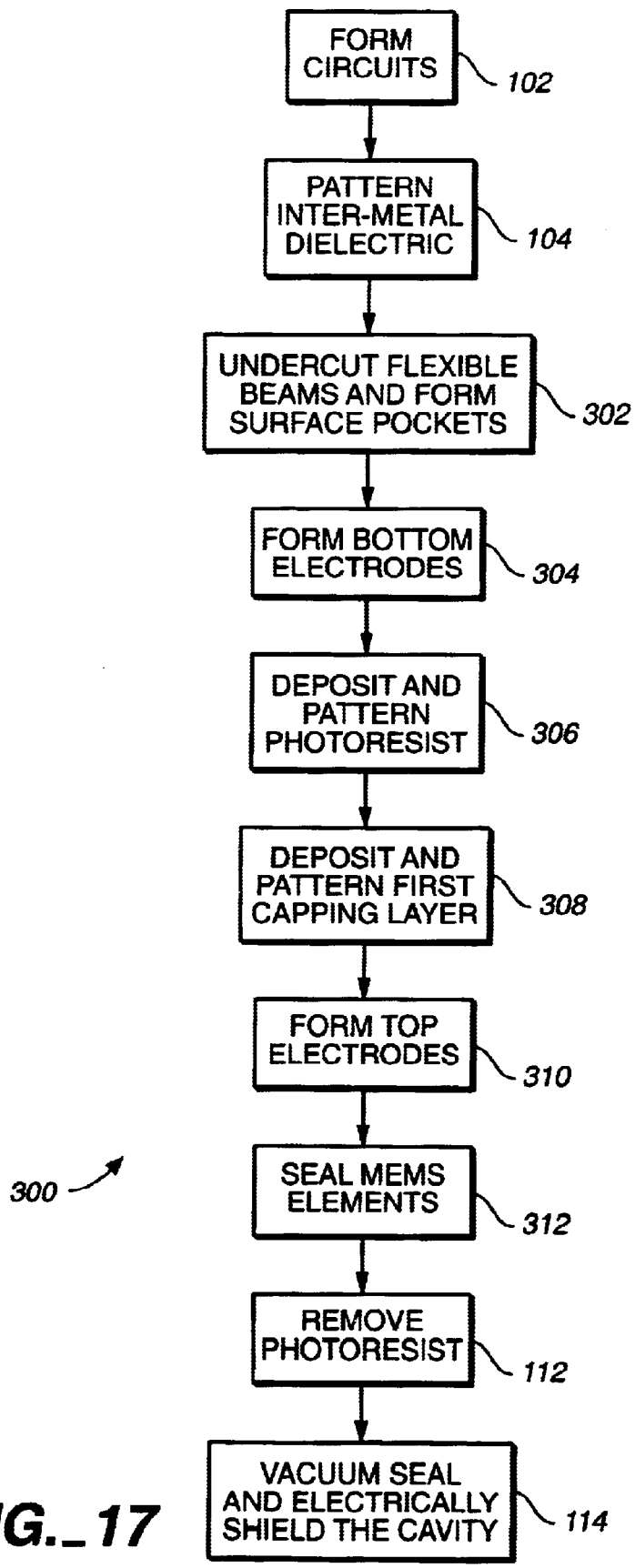
FIG._17

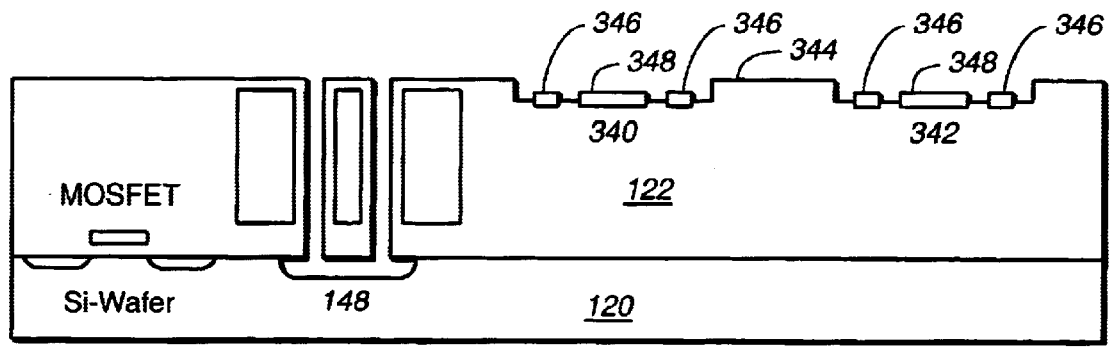
FIG._18A
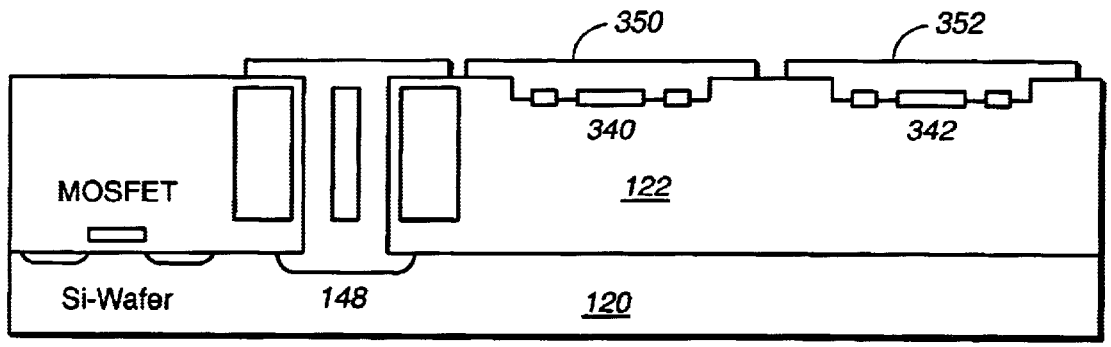
FIG._18B
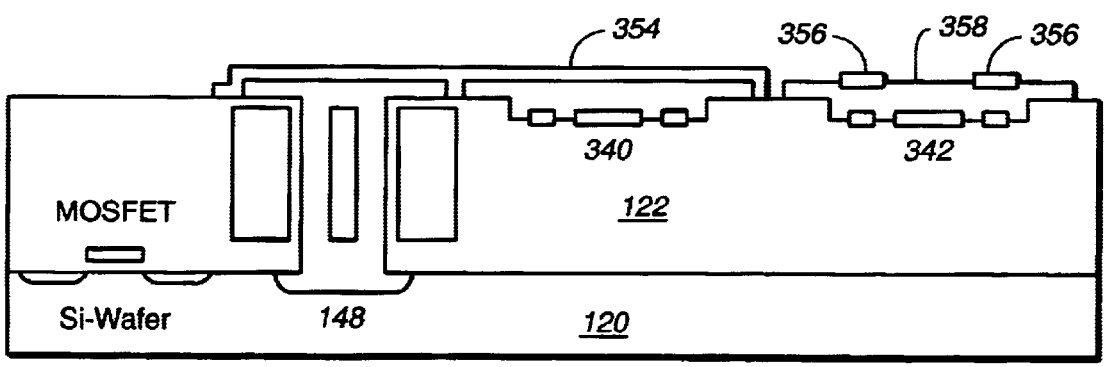
FIG._18C
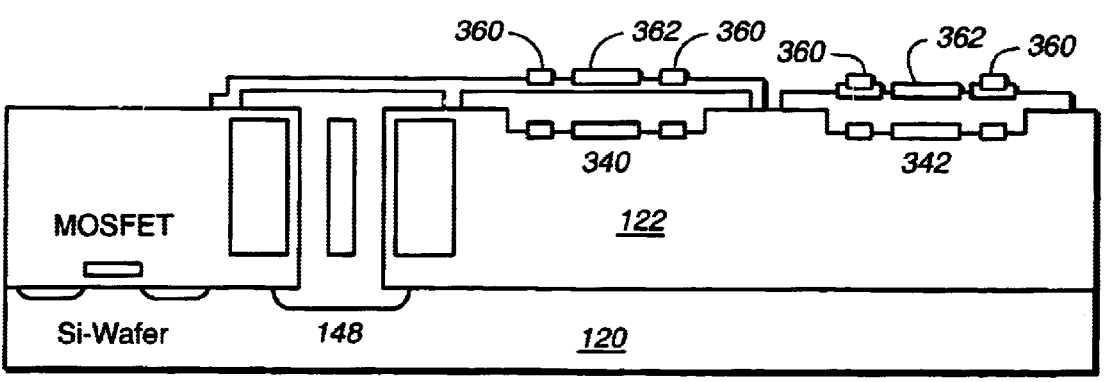
FIG._18D

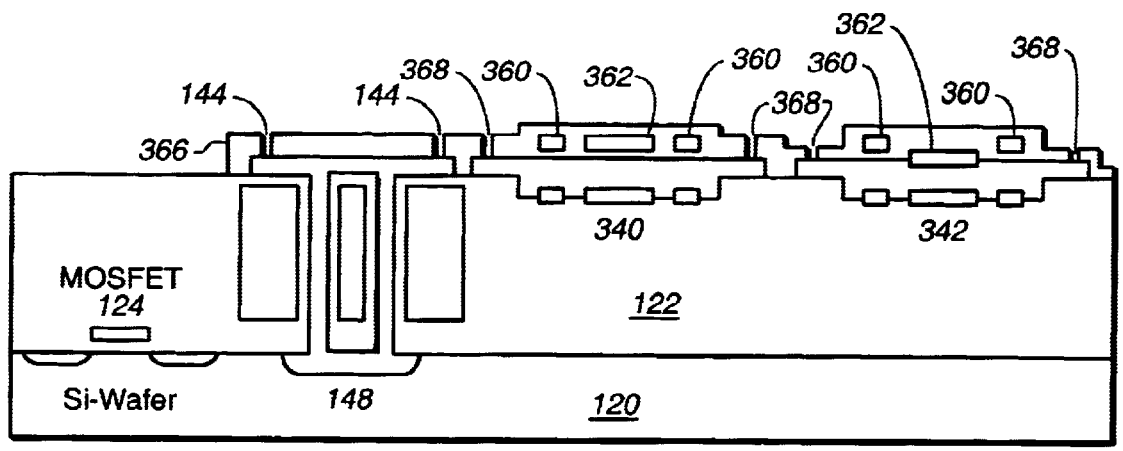
FIG._18E
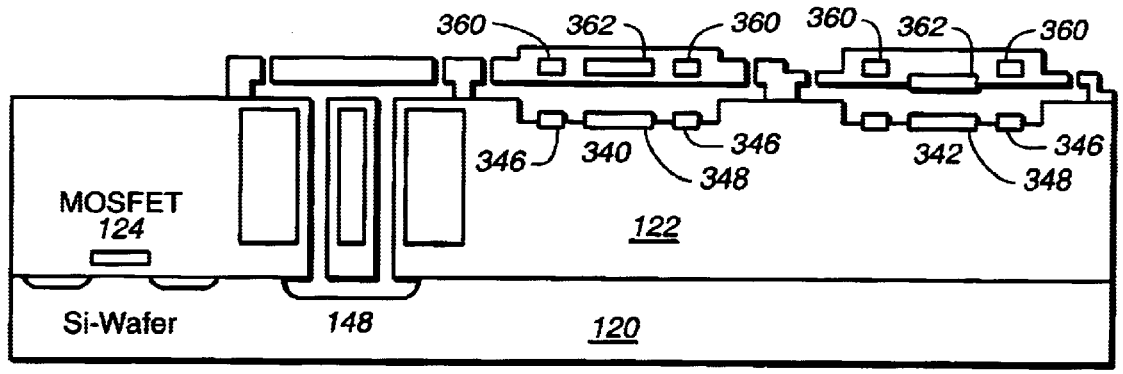
FIG._18F
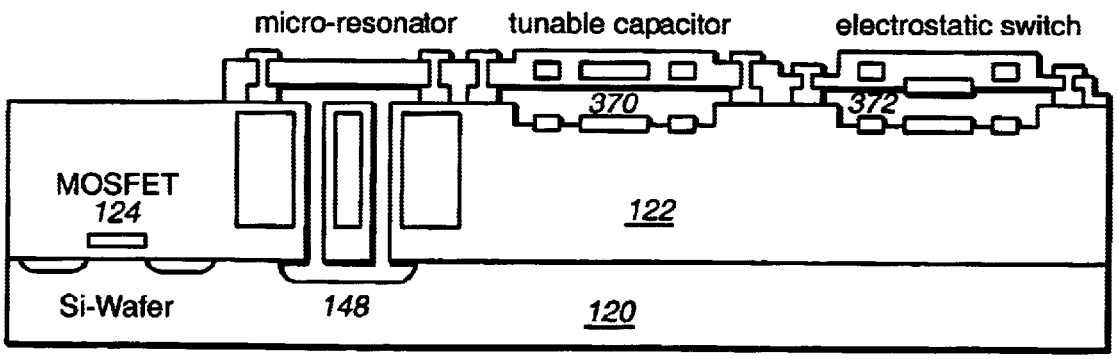
FIG._18G

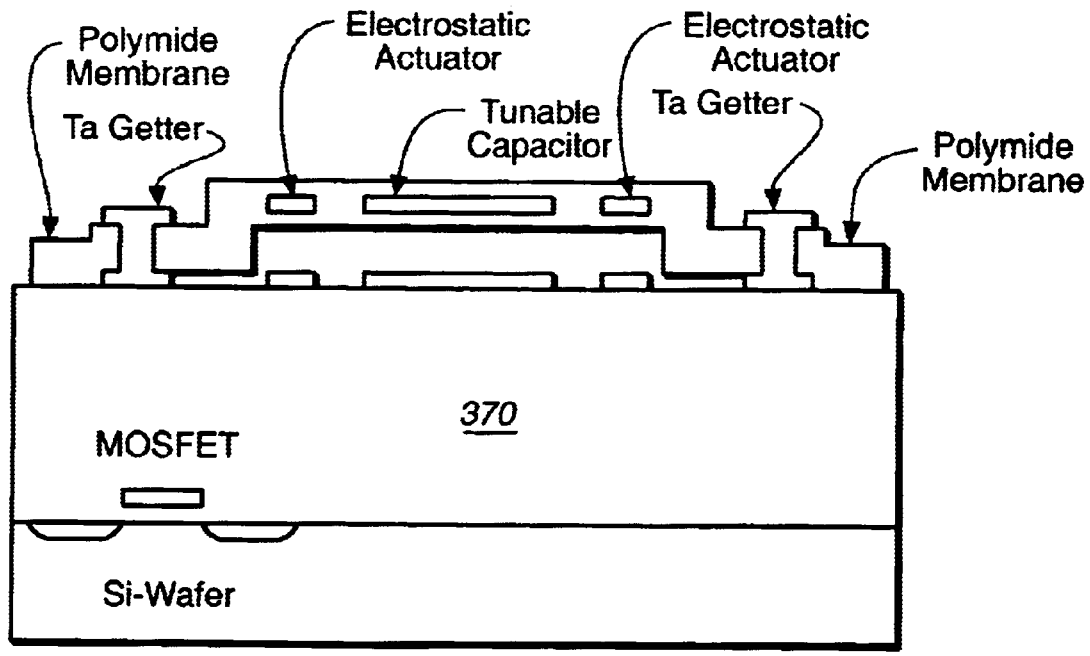
FIG._19A
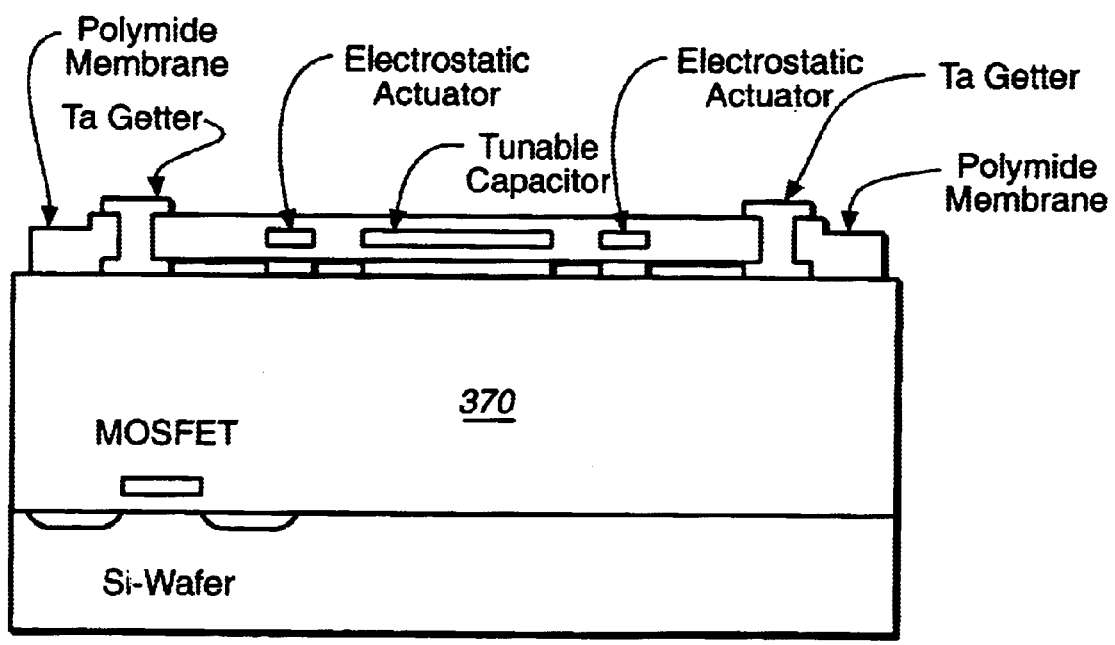
FIG._19B

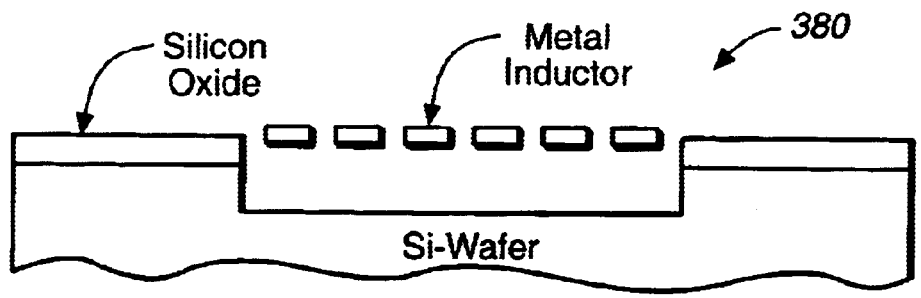
FIG._20A
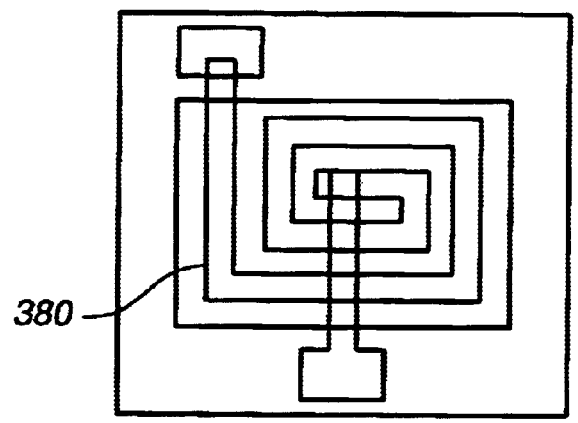
FIG._20B
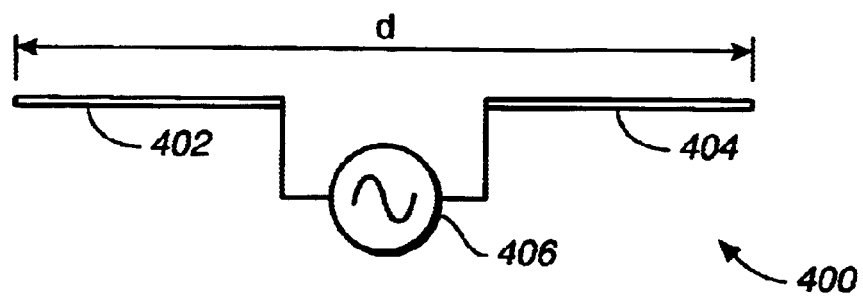
FIG._21

VACUUM SEALED RF/MICROWAVE MICRORESONATOR

BACKGROUND OF THE INVENTION

1. Field of the Invention

The present invention is related to passive electrical elements and, more particularly, to passive electrical currents used in an IF filter for a wireless communications system.

2. Background Description

Wireless communications is evolving to allow individuals access to information as well as contacting other people, anywhere, anyplace, and at anytime. Generally, examples of state of the art wireless communications systems include FM radio, television, personal communications systems, wireless PBXs, wireless local area networks (LANs) and mobile or cellular telephone communication networks. These new communications systems and devices are dramatically changing society and allowing workers to become "untethered" from their information sources.

The most common wireless communications system receiver is called a super-heterodyne receiver. Super-heterodyne receivers, which are well known in the art, receive a communications information signal on a radio frequency (RF) carrier that is combined with a slightly lower frequency to generate a sum and a difference signal. The communications information signal is included on each of the sum and difference signals. The higher frequency sum signal (which may be at a frequency nearly twice that of the RF input) is filtered out leaving only the difference or intermediate frequency (IF) signal. The intermediate frequency is also called the beat or heterodyne frequency. The IF signal is between RF and the output signal band, which is typically in the audible frequency range. The IF signal is further filtered, amplified and then, passed to a detector which extracts the input signal to produce the desired audio or other output signal.

FIG. 1 is an example of a typical state of the art super-heterodyne wireless receiver 50. Input RF at an RF antenna 52 passes to a ceramic filter 54. The ceramic filter 54 filters the received RF from RF antenna 52 and passes the filtered RF to a RF low noise amplifier (LNA) 56. The output of the RF low noise amplifier 56 is passed to a mixer 58. Mixer 58 combines an oscillator frequency from a voltage control oscillator (VCO) 60 with the amplified RF output of the low noise amplifier 56 to provide sum and difference signals, the difference signal being the IF signal. The sum and difference signals are passed to a surface acoustic wave (SAW) filter 62. SAW 62 is an intermediate filter that filters out the sum signal, passing only the IF signal. The IF signal is passed to a second low noise amplifier 64. The amplified IF output of the second low noise amplifier 64 is passed to a second mixer 66. Second mixer 66 mixes the output of the second low noise amplifier 64 with a pure IF carrier from a second VCO 68. A crystal oscillator 70 provides a base frequency to the first VCO 60 and the second VCO 68. The output of the second mixer 66 is passed to an IF crystal filter 72. The filtered output of the IF crystal filter 72 is passed to broad-band electronics.

Thus, it can be seen that all active devices (i.e., transistors) used to form the low noise amplifiers 56, 64, mixers 58, 66 and VCOs 60, 68 may be on a typical integrated circuit. The typical low power output from a state of the art passive IC device is susceptible to signal loss both from stray capacitance and inductance, as well as, ambient noise. Consequently, most of an output signal from a passive IC device (e.g., an inductor or a capacitor) may be lost on a long interconnecting wire, for example, when a capacitive pick-up is used in a microsensor. Unfortunately, the ceramic RF filter 54, IF SAW filter 62, crystal oscillator 70 and IF crystal filter 72 are not easily integratable with the other circuits using state-of-the-art integration techniques. Instead, discrete passive elements (capacitors, inductors and resistors) forming components 54, 62, 70, 72 require much more space and power than is currently available from typical state of the art solid state circuit technologies. Discrete component elements are subject to ambient conditions and variations in ambient operating conditions and so, tend to degrade system level performance. Also, because of the high frequency (RF) use of these passive components, they must be shielded. The shielding both prevents RF noise from being coupled inadvertently to the circuit, especially in inductors, as well as blocks unwanted RF radiation from the components. However, the RF shielding further increases the size of these RF passive components.

An alternative to a superheterodyne receiver that does not include an IF stage is a direct conversion receiver (DCR). Because a DCR does not have an IF stage, it does not have many of the passive components of the superheterodyne receiver. However, foregoing passive components in state of the art DCRs comes at a cost of degraded performance because state of the art DCRs require a local RF oscillator at the same frequency as the RF input signal. The DCR directly mixes an input signal from its antenna with an RF at carrier frequency from the local RF oscillator. Noise from the local RF oscillator can feed back through the receiver and antenna to the transmitter, reducing receiver sensitivity and interfering with other wireless communications devices, especially those in close proximity to the particular DCR.

Thus, there is a need for a low cost fully integrated super-heterodyne receiver. Further, there is a need for a way to include passive elements and especially resonant passive elements on integrated circuits.

BRIEF DESCRIPTION OF THE INVENTION

It is a purpose of the invention to include RF filters, resonators and other high frequency passive devices onto the same integrated circuit chips with circuits driving/being driven by those high frequency devices.

The present invention is an electromechanical structure such as a MEMS resonator formed in the surface of a semiconductor body. A flexible beam containing a conductive plate is integrally formed in a cavity in the surface of a semiconductor body. A second conductive plate is parallel to the first along a sidewall of the cavity. A voltage applied across the first and second conductive plates forces the flexible beam to vibrate horizontally. A cap layer seals the cavity and maintains a vacuum in the cavity. The structure is smaller than the wavelength of the RF signal generated therefrom and, therefore, virtually shielded.

BRIEF DESCRIPTION OF THE DRAWINGS

The present invention is illustrated by way of example and not limitation the accompanying figures in which like references indicate similar elements and which:

FIG. 1 is an example of a typical state of the art super-heterodyne wireless receiver;

FIG. 2 shows an example of steps in a method for forming a micromechanical structure or element for use in micro-electromechanical systems (MEMS) according to a preferred embodiment of the present invention;

FIGS. 3A–H each show a plan view and corresponding cross-sectional area of a micromechanical structure formed as described with the reference to the flow diagram of FIG. 2;

FIGS. 4A–B schematically show an example of a basic µresonator that has an Electrostatic/Capacitive RF MEMS structure formed according to a preferred embodiment of the invention for IC RF oscillators or RF filters, the µresonator replacing passive elements of FIG. 1;

FIG. 5 shows an example of a flexible beam;

FIG. 6 is a simple example of a measurement system for measuring physical or chemical quantities and displaying the results;

FIG. 7 shows an example of a recently demonstrated Electrostatic/Capacitive RF MEMS µresonator;

FIG. 8 is an example of a second order damped harmonic oscillator mechanical analog model to the micromachined RF oscillator in FIG. 7;

FIG. 9 graphically shows a comparison of the magnitude of the system gain with frequency for several damping factors $\zeta$;

FIG. 10 shows an example of a preferred embodiment Electrostatic/Capacitive RF MEMS µresonator that may be used with a transresistance amplifier to construct a RF MEMS oscillator;

FIG. 11 shows application of the Electrostatic/Capacitive RF MEMS structure in an oscillator;

FIG. 12 is a small-signal REF MEMS µresonator equivalent circuit model that may be used for circuit design;

FIG. 13 shows a model of such a coupled multi µresonator filter;

FIG. 14 shows an example of the spring coupled preferred embodiment Electrostatic/Capacitive RF MEMS µresonator;

FIG. 15 shows another example of a preferred embodiment Electrostatic/Capacitive RF MEMS µresonator, transresistance amplifier and termination resistors in a RF MEMS filter;

FIG. 16 shows an example of an electrical equivalent passive circuit for a quarter wavelength coupled two-µresonator filter;

FIG. 17 shows an example of a flow diagram of a preferred embodiment method for integrally forming a µresonator as well as an electrical actuator that may be a tunable capacitor or a µswitch;

FIGS. 18A–G show the steps of forming MEMS actuators simultaneously with forming µresonators integrally with active devices, such as transistors;

FIGS. 19A–B shows an example of using an electrostatic capacitive MEMS structure as tunable capacitor;

FIGS. 20A–B shows a cross-section and a plan view of an example of a high-Q microinductor;

FIG. 21 shows an example of a preferred embodiment MEMS structure modeled as a center fed linear antenna.

DESCRIPTION OF PREFERRED EMBODIMENTS

Turning now to the drawings and, more particularly, FIG. 2 shows an example of steps in a method 100 for forming a microelectromechanical (µelectromechanical) structure, device or element for use in a microelectromechanical system (MEMS) according to a preferred embodiment of the present invention. As used herein, "MEMS" structure, device, etc., is intended to refer to a structure device, etc. formed using integrated circuit formation techniques to have mechanical properties and integratable with circuits on an integrated circuit, e.g., a µelectromechanical device such as may be employed in a MEMS. The preferred embodiment MEMS structure is formed by and integrated with a typical insulated gate Field Effect Transistor (FET) semiconductor technology such as is normally referred to as CMOS.

Thus, typical CMOS integrated circuit elements are formed in step 102 using standard CMOS circuit device definition steps. Such standard CMOS steps may include preparing a semiconductor wafer, field doping the wafer, forming source/drain diffusions in a surface of the wafer and forming gates on the surface between source drain diffusions. Typical integrated circuit interconnect wiring is formed is an intermetal dielectric or insulation layer on the wafer surface above the CMOS devices and connecting individual devices together to form circuits.

In step 104 the intermetal dielectric layer is patterned to form partial cavities in areas where the MEMS devices are to be formed, e.g., spaces are formed between conductive elements that are, eventually, resonator plates, variable capacitor plates, etc. In step 106 free-moving elements are formed in the patterned areas thereby forming micromechanical elements in cavities. In step 108 cavities formed at the MEMS devices in steps 104 and 106 are filled with photoresist. In step 110 the photoresist filled cavities are capped. In step 112 the photoresist is removed from the cavities through cleanout openings in the cavity cap. Finally, in step 114 the cleanout openings are plugged in a vacuum with a getter material such that the cavities are vacuumed sealed and shielded electrically.

FIGS. 3A–H each show a plan view and corresponding cross-sectional area of a microelectromechanical structure formed as described with the reference to the flow diagram of FIG. 2. In step 102 as shown in FIG. 3A the substrate 120 has been prepared, with transistors (FETs) formed on the substrate surface and interconnects formed between the transistors thereby forming circuits. An intermetal dielectric layer 122 has been formed over the circuits, represented here by FET 124. FET 124 includes source and drain diffusions 126 with a gate 128 therebetween. Typically, gates 128 are polysilicon. Metal plates 130, 132, 134 are formed in the intermetal dielectric layer 122 along with normal interdevice wiring. Next, in step 104 as shown in FIG. 3B, a device cavity pattern is formed in the intermetal dielectric layer 120 to selectively open spaces 136, 138 between the MEMS device metal plates 130, 132, 134, opening partial cavities to the surface 140 of the silicon substrate 120. In step 106 as shown in FIG. 3C µelectromechanical device cavities are completed as silicon is etched away from beneath the center metal plate 132 to form a flexible beam with an open space 140 therebeneath. Although some lateral etching also occurs under metal plates 130, 134, they remain fixedly held in place by intermetal dielectric layer 122, which remains along one side of each fixed metal plate 130, 134 at the side opposite open spaces 136, 138.

Next, in step 108 as shown in FIG. 3D, the cavity is filled temporarily with a removable material such as photoresist 141, which is patterned to remove photoresist from and re-expose surrounding dielectric surface areas. Then, in step 110 as shown in FIG. 3E the surface area above the cavity (i.e., above the temporary photoresist) is capped with a thin nonconductive or dielectric cap, preferably formed by depositing a thin silicone dioxide ($SiO_2$) layer and then, patterning the $SiO_2$ layer photolithographically. Optionally, the dielectric cap may be a selectively deposited. In another preferred embodiment, the cap 142 is a layer of photo-imagible polyamide. Next, photoresist cleanout 144 openings are patterned photolithographically and opened to allow for the removal of the photoresist through the dielectric cap 142.

Then, in step 112 as shown in FIG. 3F, the photoresist is removed from the cavity through the cleanout openings 144 using a suitable solvent, e.g., acetone, such that the metal plate 132 is unencumbered and, essentially, is a flexible beam connected to cavity walls at either end. Finally, in step 114, a layer of tantalum (Ta) 146 is thermally deposited in a vacuum, plugging the photoresist cleanout openings, vacuum sealing the cavity, i.e., the sealed cavity forms a void in the substrate 120 with the flexible beam 132 contained therein. The tantalum acts as a getter for both embodiments to collect any oxygen or other contaminants that may remain in the void or that may result from outgassing during processing, i.e., the tantalum plugs absorb any gas left in the void, thereby further improving the vacuum therein. Thus, cavity pressure is maintained to <$10^{-6}$ torr. Excess tantalum may be removed, e.g., photolithographically, to result in the structure FIG. 3H.

Thus, an Electrostatic/Capacitive RF microelectromechanical structure 148, which may be used as a μresonator for example, is fabricated very simply and, importantly, nondestructively to underlying CMOS circuits. Removing silicon under the flexible beam 132 in step 106, e.g., using a reactive ion etch (RIE), leaves a flexible beam that moves freely in all three dimensions in the capped cavity, e.g., another electrode may be placed beneath the flexible beam. Further, in the vacuum the beam 132 is free from the normal detrimental atmospheric effects encountered for prior art such devices. Operating as a μresonator, for example, atmospheric damping would otherwise hinder resonator motion and decrease device output current. This advantage is realized by encapsulating the structural components in the void under vacuum and without requiring an otherwise prohibitively costly vacuum sealed package just to achieve $10^{-1}$ torr.

FIGS. 4A–B schematically show an example of a basic μresonator 150 that has an Electrostatic/Capacitive RF MEMS structure formed according to a preferred embodiment of the invention for IC RF oscillators or RF filters. A μresonator 150 may replace each passive element 54, 62, 70, 72 of FIG. 1. In this example, wires forming the μresonator 150 are modeled as two rectangular parallelepipeds 152, 154 that are metal electrodes fabricated in a typical CMOS circuit fabrication process, such as is described hereinabove. The metal electrodes 152, 154 are completely encased by insulation layer 156 which is an inter-metal dielectric layer of the particular CMOS process. In this example, silicon has been removed from substrate 158 under flexible beam (parallelpiped 154) with a typical RIE step using $SF_6$, such that, for example, the flexible beam 154 is attached at both ends, but is free to vibrate. For MEMS structures such as are formed as described herein, gravity is an insignificant force and need not be considered. Silicon remains at least along one side of the fixed drive plate or beam, e.g., under the fixed parallelpiped 152 and, therefore, drive beam 152 is fixedly held in place.

A force is exerted on flexible beam 154 from fixed beam 152 by applying a voltage between the fixed beam 152 and the flexible beam 154. A resulting electrostatic field exerts a force on the flexible beam 154, pulling it laterally towards the fixed beam 152 and causing the flexible beam 154 to bow. When that force is removed, mechanical counter forces within the flexible beam 154 cause it to return toward and past its equilibrium position, i.e. bowing away from the fixed beam 152, eventually settling back to its original unbowed position. However, alternately applying and removing the force causes the flexible beam 154 to vibrate. Thus, with appropriate modification as described hereinbelow the MEMS device 150 has application as a RF MEMS oscillator or as a RF MEMS filter.

FIG. 4B shows relevant dimensions for determining force applied to the flexible beam 154 from the fixed beam 152 by an electrostatic field for two parallel metal plates at facing sides 162, 164 with width w and length L correspond 152, 154. At maximum potential or breakdown voltage ($V_D$) applied between the flexible beam 154 and the fixed beam 152, separated by (spaced apart) a distance d and by a dielectric material having a dielectric constant $\epsilon_0$ and, where the plates 162, 164 have a parallel area wL; the maximum electrostatic potential energy, $E_m$, stored between the parallel plates is given by:

$$E_m = \frac{\epsilon_o wLV_b^2}{2d}$$

The electrostatic force applied to and causing one of the metal electrodes (154) to move with respect to the other electrode (152) in any direction, is the negative spatial derivative in the direction of E. So, a translational movement of one electrode in the x direction leads to a force $F_x$ that is given by:

$$F_x = -\frac{\partial E}{\partial x} = \frac{\epsilon_o wLV^2}{2x^2},$$

At distance d and with a voltage V applied, $$F_x = -\frac{\partial E}{\partial x} = \frac{\epsilon_o wLV^2}{2d^2}.$$

FIG. 5 shows an example of pure bending of a beam 170, i.e., bending wherein the cross section of the flexible beam remains planar and normal to the longitudinal fibers of the beam. This model may be used to calculate the beam deflection with a constant radius of curvature, i.e., where the flexible beam 170 is bent (bowed) into a circular arc, ρ. Accordingly, the deflection of the flexible beam due to an applied force may be calculated using well known methods such as are described, for example, by S. Timoshenko, in *Theory of Elasticity*, McGraw Hill Book Company, 1934. Thus, stress $\sigma_y$ at any location x (the x=0 point is located in the middle of the flexible beam) with torque Γ applied to the flexible beam and the moment of inertia is I may be calculated $$\sigma_y = \frac{x\Gamma}{I}.$$

So, for the flexible beam 170, the moment of inertia is equal to:

$$I = \frac{wh^3}{12}.$$

Thus, by applying a uniform force to the left side of the flexible beam 170 its maximum deflection (y=L/2) may be calculated with respect to applied force f, given by:

$$x(y = L/2) = \frac{fL^4}{384EI}, \text{ where in } E \text{ is the Modulus of elasticity.}$$

Accordingly, having thus described the physical properties of the fixed/flexible beam combination of the example of FIGS. 4A–B and 5 which may be formed as described with reference to the examples of FIGS. 2 and 3A–H, the microelectro mechanical structure of the present invention may be adapted for use as a sensor or an actuator in combination with an appropriate circuit or circuits. Sensors and actuators convert one form of energy into another. Both enable quantitative measurements on a large variety of physical and chemical phenomena. Although normally a device that converts electrical energy into mechanical energy is referred to as an output transducer or an actuator, it also may be considered a sensor. The appropriate label of sensor or actuator is not based on the physics involved, but on the intent of its application. Typically, if the intent is to measure a change, the device being used for the measurement is a sensor; if the intent of the use is the change or action itself, the device is an actuator.

Basically a sensor coverts a physical or chemical quantity into an electrical signal. The electrical signal is usually sent to some processor where it may be modified (e.g., amplified) to serve a useful function. Essentially, an actuator is the opposite of a sensor, converting an electrical signal into a physical or chemical quantity (e.g., light or sound) that can be interpreted.

FIG. 6 is a simple example of a measurement system 180, wherein a sensor 182 passes a signal to a processor 184 which drives an actuator 186 for measuring physical or chemical quantities and displaying the results. The input signal to the measurement system from sensor 182 is the measureand and corresponds to the physical or chemical quantity being measured. Normally, sensors are classified according to the function performed or the physical principle at work. Additionally, sensors may be classified according to the main form of energy contained in the signal. Table 1 shows example of various energy forms that are normally used to categorize sensors each paired with a corresponding typical mesurand.

TABLE 1

| Form of Signal | Measurands |
| --- | --- |
| Thermal | Temperature, heat, heat flow, entropy, heat capacity, etc. |
| Radiation | Gamma rays, X-rays, ultra-violet, visible, infra-red, microwaves, radio waves, etc. |
| Mechanical | Displacement, velocity, acceleration, force, torque, pressure, mass, flow, acoustic wavelength and amplitude etc. |
| Magnetic | Magnetic field, flux, magnetic moment, magnetisation, magnetic permeability etc. |
| Chemical | Humidity, pH level and ions, concentration of gases, vapors and odors, toxic and flammable materials, pollutants etc. |
| Biological | Sugars, proteins, hormones, antigens etc. |
| Electrical | Charge, current, voltage, resistance, conductance, capacitance, inductance, dielectric permittivity, polarization, frequency etc. |

Sensors 182 are used to gather information. Typically, usefulness of a sensor is determined by its performance, cost and reliability. A large sensor may have excellent operating characteristics but may be unmarketable or unusable because of its size. A smaller sensor may be lighter, and have a wider application range. When size is not determinative, cost may be the single most important factor. Even though less material is needed to manufacture a small sensor, the manufacturing cost may dwarf material cost. Ideally, a sensor has a linear output signal response y(t) to a physical input x(t) amplified by an amplification factor or sensitivity S and, the output signal y(t) instantaneously follows the input signal x(t), i.e., $$y(t)=S*x(t).$$

The sensor response is the change in the output signal ($\Delta y(t)$) and is given by $\Delta y(t)=y(t)-y_o$ where $y_o$ is the sensor baseline, i.e., the steady state unloaded output of the sensor. Ideally, $y_o$ is time independent and unaffected by other physical system properties. Also, ideally, the sensor response is instantaneous, undelayed from input to output.

However, in reality there is some delay from sensor input to output. This delay, known as sensor response time, $\tau$, is the time delay after the input for the sensor to reach 90% of its final value, also referred to as $t_{90}$. The working range of a sensor is the measurand range over which the sensor measures. The sensor resolution is the minimum change required in the measurand that is necessary to produce a detectable change at the output. Table 2 is an example of desirable characteristic sensor features and associated ideal values.

TABLE 2

| Characteristics | Ideal value |
| --- | --- |
| Response, $\Delta y$ | Exactly linear and noise free. |
| Baseline, $y_0$ | Zero point. |
| Response time, $\tau$ | Zero for instantaneous response. |
| Frequency band-width | Infinite for instantaneous response. |
| Time to reach 90% of final value, $t_{90}$ | Zero for instantaneous response. |
| Full-scale reading, $y_{max}$ | Calibrated max. output, e.g. 20 mA current. |
| Working range, $(y_{max}-y_{min})$ | Infinite. |
| Sensitivity, S | High and constant over entire working range. |
| Resolution | Infinite. |

Table 3 provides examples of some common but undesirable real sensor characteristics.

TABLE 3

| Characteristic | Meaning |
| --- | --- |
| Non-linearity | Response is not proportional to the input signal. |
| Slow response | Output is slow to reach a steady-state value (i.e., large value of $\tau$). |
| Small working range | Operating range is highly restricted. |
| Low sensitivity | Sensor can only respond to large input signals (i.e. S is small). |
| Sensitivity drift | Output varies with time, e.g. change in ambient temperature. |
| Baseline drift | Output varies with time. |
| Offset | Systematic error in sensor output. |
| Offset drift | Offset drifts in time, e.g. due to sensor ageing. |
| Ageing | Sensor output changes with time. |
| Interference | Output is sensitive to external conditions, e.g. stray electromagnetic radiation, humidity etc. |
| Hysteresis | Systematic error in the input-output curve. |
| Noise | Output contains an unwanted random signal. |

Actuators also may be classified according to use or signal, i.e., by physical response. Table 4 shows examples of actuators classified according to function and signal.

TABLE 4

| Function | Actuator | Signal | Principle |
| --- | --- | --- | --- |
| Display | Light emitting diode. | Radiant | Current generation of photons. |
| | Visual display unit. | Radiant | Fluorescent screen. |
| | Liquid crystal display. | Radiant | Transmittance of polarized molecular crystals. |
| Record | Thermal printer. | Thermal | Ink is melted. |
| | Magnetic recording head. | Magnetic | Magnetization of thin films on computer disk |
| | Laser | Radiant | Ablation of material on optical disc. |
| Transmit | Loudspeaker. | Mechanical | Generation of sound. |
| | Aerial. | Radiant | Generation of radio waves. |
| | Electric motor. | Mechanical | Generation of motion. |

Typically, actuators convert electrical energy into an appropriate action, often controlled by a sensor control unit. Actuators facilitate actions in response to energy, such as a signal from pushing a button that causes an actuator to open a valve, position a mirror, etc. Micro-actuators are actuators that are capable of producing micron-scale motion. Miniaturization and microminiaturization is more complicated for actuators than it is for sensors, because power is proportional to volume (i.e., a $3^{rd}$ order effect) and so, does not scale linearly in the microdomain. However, to induce micromotion, actuators do not need to be micron-scale themselves.

As noted above, capacitive type MEMS sensors convert a physical environment sensor response (i.e., to acceleration, to a change in temperature, etc.) into a capacitance change. Since a simple capacitor is two electrodes separated by a dielectric, e.g., two plates separated by air, the capacitance change can be in response to motion of one of the electrodes with respect to the other, e.g., motion of flexible beam 154 of FIG. 4B with respect to fixed beam 152. Thus, the capacitance $C_o$ between two parallel electrodes 152, 154 with a surface area S=ωL, separated by a distance d by a dielectric with dielectric permittivity ε, is given by $$C_o = \varepsilon \frac{S}{d}.$$

Displacing one electrode (e.g., 152) by a small distance Δd, while maintaining the electrode 152 parallel to the other electrode (154), changes capacitance between the two electrodes 152, 154 by ΔC. Provided that Δd is much smaller then d, the sensitivity to such displacement is closely approximated by:

$$\frac{\Delta C}{\Delta d} = -\varepsilon \frac{S}{d^2}.$$

Also, for this sensor with capacitor voltage (V) constant, capacitor current $I_C$ is defined by:

$$I_C = \frac{d(CV)}{dt} = \frac{VdC}{dt} \cong V\frac{\Delta C}{\Delta t}.$$

Therefore, to design capacitive sensors with a high sensitivity, it suffices to make capacitor plate area large and gap distance narrow. However, other technology related factors including sensor dimensions, fabrication accuracy and reproducibility, and damping of electrode movement constrain both values. So, because stray capacitance, e.g., wiring, etc., reduces sensor signal, it is preferable for capacitive sensors to have a sense circuit that is as close to the sensor as possible to minimize signal reducing stray capacitances.

Integrated circuits fabricated according to the present invention wherein sensors, sense circuits and processors using signals from the sensors are of the same material and on the same single chip, have minimized electrical circuit disturbance without degraded sensor performance. Thus, the present invention overcomes two main obstacles of prior art approaches: materials incompatibility between the sensor and the electrical circuitry because both are from the same material (from the same chip); and, electrical device thermal budget constraints are met because normal device processing is used to form the MEMS structure, i.e., nothing or almost nothing out of the ordinary is required. In particular, some materials used in prior art approaches to construct sensors were a source of FET gate oxide contamination. Gate oxide contamination, in most cases, rendered nonfunctional the electrical circuits intended to drive actuators or sense sensor signals. Also, the temperatures needed to fabricate the prior art sensors were so high (i.e., in excess of the fabrication thermal budget) to cause the drain and source dopants to out diffuse deeply into the silicon wafer, again rendering the electrical circuits non-functional.

Thus, using the present invention, electric/capacitive RF MEMS oscillators and filters may be made on a standard CMOS chip that, heretofore, were unavailable with such CMOS processes. This was especially true for forming the MEMS structures on the same CMOS chip. For example, C.T.-C. Nguyen, "Frequency-selective MEMS for miniaturized communications devices (invited)," *Proceedings*, 1998 IEEE Aerospace Conference, vol. 1, Snowmass, Colo., Mar. 21–28, 1998, pp. 445–460 (hereinafter Nguyen) teaches one such prior art approach to forming micro-scale high-Q oscillators and mechanical bandpass filters under vacuum with an area on the order of 30 μm×20 μm with Qs over 80,000. The Nguyen devices have center frequencies up to 14.5 MHz, center frequency temperature coefficients in the range of –10 ppm/° C., and more than 64 dB of passband rejection. Surface micromachining techniques have been used to fabricate high processing temperature (~950° C., PSG anneal) Electrostatic/Capacitive RF MEMS μresonators. Unfortunately, as Nguyen described, these high temperatures are incompatible with state of the art CMOS circuits (i.e., those with device dimensions <0.18 μm).

Advantageously, a RF MEMS μresonator formed according to the present invention has improved performance over these otherwise unacceptable approaches, providing center frequencies up to 2.5 Ghz, with a significantly simplified fabrication process that produces a RF MEMS μresonator on a state of the art CMOS chip. Further advantages of a μresonator formed according to the present invention will be better understood in view of some of these prior approaches.

FIG. 7 shows an example of a recently demonstrated such Electrostatic/Capacitive RF MEMS μresonator 190, as described in Nguyen. A drive voltage is applied to drive electrode 192 which applies a force to the flexible beam 194, causing it to move perpendicular to the surface 196 of the silicon wafer (up and down) and the sense electrode 198 thereon. The sense electrode 198 generates a signal that reflects the motion of the flexible beam 194.

Applying a periodic force in a specific frequency range (i.e., the resonant frequency of the beam 194) causes the flexible beam 194 to enter mechanical resonance, greatly increasing its motion. Flexing the beam 194 causes a very large change in capacitance between the flexible beam 194 and sense electrode 198. This change in capacitance results in a corresponding current flow. Thus, by feeding current back into the drive electrode 192, the structure 190 oscillates as an RF MEMS oscillator.

FIG. 8 is an example of a second order damped harmonic oscillator 200 mechanical analog model to the micromachined RF oscillator 190 in FIG. 7 with corresponding elements labeled identically. The flexible beam 192 is modeled, essentially, as a mass-spring-damper system. In this example, loading force, $-md^2(x_{in})/dt^2$, drives a second order damped harmonic oscillator, $$m\frac{d^2(x_{out})}{dt^2} + b_m\frac{d(x_{out})}{dt} + k_m x_{out} = -m\frac{d^2(x_{in})}{dt^2}$$

where $x_{out}$ is the displacement of the flexible beam 192 with respect to the Si wafer, $-b_m d(x_{out})/dt$ describes the damping force 202 applied to the flexible beam 192, m is the mass of the flexible beam 192 and $k_m$ is the spring 204 constant of the flexible beam 192. Under constant acceleration, the displacement $x_{out}$ is directly proportional to the input acceleration $d^2(x_{in})/dt^2$ where, $$x_{out} = \frac{m}{k_m}\frac{d^2(x_{in})}{dt^2}.$$

Steady state occurs at time $t > (b_m/m)$ and, so, for quick settling; light damping and a heavy mass are required. A small spring constant $k_m$ ensures a good sensitivity. Under varying acceleration conditions, the dissipater 202 plays a more important role.

FIG. 9 graphically shows a comparison of the magnitude of the system gain with frequency for several damping factors $\zeta$. The damping factor and resonance frequency ($w_o$) of vibration of the mechanical system are given by $$\zeta = \frac{b_m}{s\sqrt{\frac{k_m}{m}}} \text{ and } w_0 = \sqrt{\frac{k_m}{m}}$$

Thus, it can be seen from this model 200 that the flexible beam 192 can be selected to run in different modes. Selecting a large mass and small spring constant (at fixed damping) results in a low resonant frequency. Alternatively, selecting a small mass and a large spring constant results in a high resonant frequency. Therefore, the resonant frequency of the flexible beam 192 can be selected by varying its mass and/or its spring constant. Further, reducing the damping factor causes the motion of the flexible beam to significantly increase, extending its amplitude at its resonant frequency. As can be seen from the above described capacitance calculation, increasing resonant amplitude increases the output signal from the sense electrode, increasing the performance of the MEMS component for RF signal applications.

From the mechanical analog 200, the damping factor can be reduced by increasing the product of the mass and spring constant and/or by decreasing $b_m$. Correspondingly, $b_m$ can be reduced for the RF MEMS structure by reducing air pressure. Reducing air pressure for the free standing flexible beam 192 of FIG. 8 is a complicated task, that may require a special vacuum sealed package. However, air pressure is minimized for a preferred embodiment RF MEMS resonator fabricated as described above with reference to FIGS. 2 and 3A–H. In fact, the preferred embodiment flexible beam is contained in a vacuum.

Continuing, the various resonant frequencies of the flexible beam 192 can be calculated using Newton's second equation of motion. In particular $$c^2\frac{\partial^4 w}{\partial x^4}(x,t) + \frac{\partial^2 w}{\partial x^2}(x,t) = 0,$$

$$c = \sqrt{\frac{EI}{\rho A}}$$

where $\rho$ is the density of the flexible beam 192, E is the modulus of elasticity of the flexible beam 192, I is the moment of inertia of the flexible beam 192, A is the cross sectional area of the flexible beam 192, and w(x,t) is the motion of the flexible beam 192. Using separation of variables, the following results are obtained:

$$w(x,t) = W(x)T(t)$$

$$T(t) = A\cos(\omega t) + B\sin(\omega t)$$

$$W(x) = C_1\cos(\beta x) + C_2\sin(\beta x) + C_3\cos h(\beta x) + C_4\sin h(\beta x)$$

$$\omega_n = (\beta_n L)^2\sqrt{\frac{EI}{\rho AL^4}}$$

$$\cos(\beta_n L)\cos h(\beta_n L) = -1$$

where $\omega_n$ is the resonant frequency of the beam 192 and $\beta_n$ is dependent on boundary conditions. The flexible beam shown in FIG. 5 has a fundamental resonant frequency $\omega_o$ given by:

$$\omega_o = \sqrt{\frac{192EI}{0.37\ mL^3}}$$

So, for example, the resonant frequency of the flexible beam 170 shown in FIG. 5 of either Al or Cu and where for Cu, $E=128\times10^9$ N/m$^2$, and $\rho=8960$ kg/m$^3$; while for Al, $E=70\times10^9$ N/m$^2$ and $\rho=2700$ kg/m$^3$ and with w=3 $\mu$m, values for the resonant frequency and the spring constant are as shown in Table 5.

TABLE 5

Resonant Frequency and Spring Constant of the Flexible Beam

| $f_o$ (Cu) | $m_r$ (kg) | $k_r$ (N/m) | h/L ($\mu$m/$\mu$m) | $f_o$ (Al) | $m_r$ (kg) | $k_r$ (N/m) |
|---|---|---|---|---|---|---|
| 5 MHz | $2.7 \times 10^{-13}$ | $1.0 \times 10^4$ | .5/20 | 7 MHz | $8.1 \times 10^{-14}$ | $5.6 \times 10^3$ |
| 20 MHz | $1.1 \times 10^{-12}$ | $6.7 \times 10^5$ | 2/20 | 27 MHz | $3.2 \times 10^{-13}$ | $3.5 \times 10^5$ |
| 40 MHz | $2.2 \times 10^{-12}$ | $5.3 \times 10^6$ | 4/20 | 53 MHz | $6.5 \times 10^{-13}$ | $2.9 \times 10^6$ |

TABLE 5-continued

Resonant Frequency and Spring Constant of the Flexible Beam

| $f_o$ (Cu) | $m_r$ (kg) | $k_r$ (N/m) | h/L (μm/μm) | $f_o$ (Al) | $m_r$ (kg) | $k_r$ (N/m) |
|---|---|---|---|---|---|---|
| 20 MHz | $1.3 \times 10^{-13}$ | $7.9 \times 10^4$ | .5/10 | 27 MHz | $4.1 \times 10^{-14}$ | $4.5 \times 10^4$ |
| 79 MHz | $5.4 \times 10^{-13}$ | $5.3 \times 10^6$ | 2/10 | 107 MHZ | $1.6 \times 10^{-13}$ | $2.8 \times 10^6$ |
| 158 MHz | $1.1 \times 10^{-12}$ | $4.3 \times 10^7$ | 4/10 | 213 MHz | $3.2 \times 10^{-13}$ | $2.3 \times 10^7$ |
| 79 MHZ | $6.7 \times 10^{-14}$ | $1.7 \times 10^4$ | .5/5 | 107 MHz | $2.0 \times 10^{-14}$ | $9.2 \times 10^3$ |
| 316 MHz | $2.7 \times 10^{-13}$ | $1.1 \times 10^6$ | 2/5 | 426 MHz | $8.1 \times 10^{-14}$ | $5.8 \times 10^5$ |
| 634 MHz | $5.4 \times 10^{-13}$ | $8.5 \times 10^6$ | 4/5 | 853 MHz | $1.6 \times 10^{-13}$ | $4.7 \times 10^6$ |

FIG. 10 shows an example of a preferred embodiment Electrostatic/Capacitive RF MEMS μresonator 210 that may be used with a transresistance amplifier to construct a RF MEMS oscillator. This device 210 is electrically similar to the typical state of the art Electrostatic/Capacitive RF MEMS μresonator 190 shown in FIG. 6. However, this preferred embodiment device 210 vibrates horizontally instead of vertically. The Electrostatic/Capacitive RF MEMS μresonator 210 is excited electrostatically and horizontally by parallel plate metal drive electrodes 212d, 214d. Parallel plate metal sense electrodes 212s, 214s sense plate movement and, therefore, a resonant vibration. In addition, as noted above, the fabrication process of the present invention is compatible with state of the art CMOS fabrication processes and is much simpler to implement than the surface micromachining techniques used for the state of the art vertically vibrating Electrostatic/Capacitive RF MEMS μresonator 190 of FIG. 6. Separate fixed DC bias electrodes 216d, 216s provide a fixed independent reference voltage to the drive electrodes 212d, 214d and to the sense electrodes 212s, 214s, respectively, thereby minimizing electrical noise in present invention RF MEMS oscillators. In addition, two flexible beams 212, 214 increase μresonator output response and simplify the required sense circuit.

FIG. 11 shows application of the Electrostatic/Capacitive RF MEMS structure 210 of FIG. 10 in an oscillator 220. A DC bias voltage $V_p$ and an excitation voltage $v_i$ with frequency $\omega_i$ are applied between the drive electrodes 212d, 214d and one of the fixed electrodes 216d which generates a time varying force between the flexible beams 212, 214 and the fixed beam 216. The time varying force is proportional to the product $V_p v_i$ at a frequency $\omega_i$. When $\omega_i$ nears mechanical resonance for the flexible beams 212, 214, they begin to vibrate intensely. The vibrating sense electrodes 212s, 214s and the fixed sense electrode 216s form a DC biased time varying capacitor ($C_o$). The fixed voltage (V) across time varying capacitor $C_o$ results in a time varying charge $Q=C_oV$. The time varying charge results in a current through this time varying capacitor at the sense electrodes 212s, 214s, is $$i = \frac{dQ}{dt} = \frac{d(C_oV)}{dt} = V_p \frac{dC_o}{dt} = V_p \frac{\partial C_o}{\partial x} \frac{\partial x}{\partial t}$$

This current (i) is the output of the μresonator.

The current output from the μresonator 210 is an input 222 to a sustaining transresistance amplifier 224, which converts the current into a voltage. The output voltage 226 of the transresistance amplifier 224 is positive feed back to the driver electrodes 212d, 214d of the μresonator 210. Under the proper conditions the transresistance amplifier 224 output is a self-sustaining cyclical frequency (i.e. this circuit 220 is a RF MEMS oscillator).

FIG. 12 is a small-signal equivalent circuit 230 model for the REF MEMS μresonator 210 that may be used, for example, in circuit design. Electrical impedances into each of the ports, are modeled by LCR tank circuits characterized by $$C_{xn} = \frac{\eta_n^2}{k_r}, \quad L_{xn} = \frac{m_r}{\eta_n^2}, \quad R_{xn} = \frac{\sqrt{k_r m_r}}{Q \eta_n^2}$$

and further in parallel with a shunt capacitor 232 where $m_r$ is the effective mass of the μresonator flexible beams 212, 214 and $k_r$ is the corresponding spring constant of the μresonator. Port-to-port coupling is modeled by current controlled current sources 236, where $$\frac{\partial C_n}{\partial x}$$

is the change in capacitance per unit displacement at port n and $$\phi_{mn} = \frac{\eta_m}{\eta_n}, \quad \eta_n = V_{pn} \frac{\partial C_n}{\partial x}.$$

So, provided the bandwidth of the sustaining transresistance amplifier 224 is much larger than the oscillation frequency, oscillation start-up occurs when the loop gain ($A_l$) is greater than unity. For the RF MEMS oscillator 220 of FIG. 10, the loop gain $A_l$ is given by:

$$A_l = \frac{R_{amp}}{R_{x12} + R_i + R_o}$$

where $R_i$ is the input resistance of the transresistance amplifier 224, $R_o$ is the amplifier's output resistance, $R_{amp}$ is the amplifier's transresistance gain, and $R_{x12}$ is the equivalent series motional resistance between ports 1 and 2 of the μresonator 210 and is given by:

$$R_{x12} = -\frac{v_1}{i_2} = -\frac{R_{x1}}{\phi_{21}}$$

Table 6 is an example of the approximate transresistance gain necessary for the onset of oscillation, i.e., the equivalent series motional resistance of the l&resonator at $V_p=10V$ and Q=20,000.

TABLE 6

| | | Equivalent Series Motional Resistance | | | |
|---|---|---|---|---|---|
| L (mm) | C(F) | DC/Dx (F/m) | $\eta_u$ (V*F/m) | $R_{X1}$—Cu(KW) | $R_{X1}$—Al(KW) |
| 5 | $1.33 \times 10^{-16}$ | $5.2 \times 10^{-8}$ | $5.2 \times 10^{-7}$ | 396 | 160 |
| 10 | $2.66 \times 10^{-16}$ | $1.04 \times 10^{-7}$ | $1.0 \times 10^{-6}$ | 320 | 125 |
| 20 | $5.31 \times 10^{-16}$ | $2.07 \times 10^{-7}$ | $2.07 \times 10^{-6}$ | 40 | 16 |

A RF bandpass filter is characterized as having a sharp roll-off if its passband width is approximately equal to its 60 dB bandwidth and with low-ripple, constant transmission voltage within the passband, and large stopband rejection, i.e., its ultimate attenuation is greater than 60 dB. The MEMS structure devices of the present invention form a suitable, low cost, sharp roll-off such RF bandpass filter by spring coupling a number of μresonators of the present invention with integrally formed coupling springs.

FIG. 13 shows a model of such a coupled multi μresonator filter 240 wherein the frequency of each vibration μresonator (3 in this example 242, 244, 246) corresponds to a distinct peak in the force-to-displacement frequency characteristic and to a distinct, physical mode shape of the coupled mechanical μresonator system. In its lowest frequency mode, all 3 μresonators 242, 244, 246 vibrate in phase; in its middle frequency mode, ideally the center μresonator 244 remains motionless, while the end μresonators 242, 246 vibrate 180° out of phase; and in its highest frequency mode, each μresonator 242, 244, 246 is phase-shifted 180° from its adjacent neighbor. The complete mechanical filter 240 has a jagged passband 248. Optionally, termination resistors (not shown) may be included to lower the Q of each of the input and output resonators 242, 246, which in turn flattens the passband response and achieves filter characteristics similar to that of a conventional RF bandpass filter.

Characteristically, integrated circuit processes have closely matched parameter tolerances for chips formed on the same wafer. Typically, hundreds of chips are formed simultaneously on a single semiconductor wafer with each wafer being formed with a group of wafers or in a lot. Chip parameters have much wider variation wafer to wafer and lot to lot. So, for example, by forming the multi-μresonator 240 on a single chip, the μresonators are much closer to identical, with nearly identical spring dimensions and resonant frequencies. For such single chip designs, the passband center frequency 248c is the common resonant frequency $w_o$ of the μresonator 240 as determined by its geometry and physical properties. The filter bandwidth, however, as defined by right and left sidebands 248r, 248l and is proportional to the ratio of the coupling spring stiffness to the stiffness of the μresonator. Therefore, it is possible to select both $\omega_o$ and the bandwidth. The relative placement of the vibration peaks in the frequency character—and thus, the passband of the filter—is determined primarily by the stiffnesses of the coupling spring ($k_{sij}$) and of the μresonators ($k_r$). In particular, for a filter with center frequency $f_o$ and bandwidth BW, these stiffnesses must satisfy:

$$BW = \left(\frac{f_o}{k_{ij}}\right)\left(\frac{k_{sij}}{k_r}\right)$$

where $k_{ij}$ is a normalized coupling coefficient as described, for example, by A. I. Zverev in *Handbook of Filter Synthesis*, New York: John Wiley & Sons, 1967. It should be noted that the filter bandwidth is independent of the absolute values of μresonators and coupling beam stiffness; instead, the ratio $k_{sij}/k_r$ dictates bandwidth. Thus, designing a RF MEMS filter using a preferred embodiment μresonator involves two main steps: first, design a μresonator with a resonance frequency $f_o$ and stiffness $k_r$; and second, design coupling springs with values of stiffness $k_{sij}$ selected to achieve the desired bandwidth.

FIG. 14 shows another example of a preferred embodiment Electrostatic/Capacitive RF MEMS μresonator 250 that may be used with a transresistance amplifier and termination resistors to construct a RF MEMS filter substantially similar electrically to filter 220 of FIG. 10. This preferred embodiment Electrostatic/Capacitive RF MEMS μresonator 250 is excited electrostatically by parallel plate metal drive electrodes 252 and fixed reference electrodes 254 substantially as described hereinabove. Instead of a common vibrating beam, a coupling spring 256 mechanically couples the drive electrode 252 to sense electrode 258. Sense electrode 258 is capacitively coupled to second fixed reference electrode 260.

Again, in this embodiment Electrostatic/Capacitive RF MEMS μresonator, the drive electrode 252 and the sense electrode 258 are spaced above and move freely, parallel to the surface of the silicon wafer, i.e., horizontally. The drive electrode 252, sense electrode 258 and coupling spring 256 are fabricated substantially as described above with reference to the steps and structures of FIGS. 2 and 3A–H.

FIG. 15 shows an example of the spring coupled preferred embodiment Electrostatic/Capacitive RF MEMS μresonator 250 of FIG. 14 in a RF filter circuit 270. Under normal operation, the device 250 is excited electrostatically by an input signal voltage (Vin) 272 applied to the input drive electrode 252 through an input resistor 274 and capacitor 276. A resonator output current available at the sense electrode 258 from the time varying capacitance sensor passes through resistor 277 which is connected to capacitor 278 and transresistance amplifier 280. The output of trans-resistance amplifier 280 is the filter output.

Upon application of an RF signal input, the μresonator 250 vibrates horizontally, parallel to the wafer/chip surface. If the input voltage $V_{in}$ has a frequency that is within the filter passband, both μresonator elements 252, 258 will vibrate. Vibration at the sense electrode 258 provides an output current determinable as described above. The output current passes through resistor 277 and capacitor 278 which provide a termination impedance for the RF MEMS filter. Resistor 277 and capacitor 278 are a reactive voltage divider with a frequency dependent result that is the input to transresistance amplifier 280.

Coupling springs (e.g., 256) may be designed for a selected stiffness $k_{sij}$ as described by Nguyen. supra. Essentially, as described in Nguyen, coupling springs have an effective finite mass that, without special design precautions, can affect adjacent μresonators, shifting their resonant frequencies thereby causing distortion in the filter passband. To accommodate this finite coupling beam effective mass, while using identical μresonators (e.g., 250) in a RF MEMS filter (e.g., 270), the dimensions of the coupling beams must correspond to an effective quarter-wave- length of the desired operation frequency. See, K. Wang and C. T.-C. Nguyen, "High-order micromechanical electronic filters," *Proceedings*, 1997 IEEE International Micro Electro Mechanical Systems Workshop, Nagoya, Japan, Jan. 26–30, 1997 pp. 25–30. Specifically, quarter wavelength coupling with a flexural-mode coupling beam with length $L_{sij}$, width $W_{sij}$ and thickness h must satisfy:

$$\cos\alpha \sin h\alpha + \sin\alpha \cos h\alpha = 0$$

$$k_{sij} = -\frac{EI_s \alpha^3 (\sin\alpha + \sin h\alpha)}{L_{sij}^3 (\cos\alpha \cos h\alpha - 1)} \text{ where}$$

$$\alpha = L_{sij}^3 \left(\frac{\rho I_s A \omega_0^2}{E}\right)^{0.25}, \ I_s = \frac{hW_{sij}^3}{12}, \text{ and } A = W_{sij}h.$$

An equivalent mechanical circuit for such a quarter wavelength-coupling beam is a massless network of positive and negative valued springs with equal magnitudes.

FIG. 16 shows an example of an electrical equivalent passive circuit 290 for a quarter wavelength coupled two-μresonator filter as in the example of FIG. 15. In this example, quarter wavelength coupling springs corresponds to capacitive T-networks, wherein:

$L_{xn} = m_r/\eta_n^2$ $R_{xn} = (k_r m_r)^{1/2}/Q\eta_n^2$ $C_{xn} = \eta_n^2/k_r$ $C_{on}$ =shunt capacitance to ground $C_s = k_{sc}/j\omega = -(EI_s \alpha^3(\sin \alpha + \sin h\alpha))/j\omega L_s^3(\cos\alpha \cos h\alpha - 1)$ $C'_s = -C_s$ $\alpha = L_s((\rho w_s h\omega^2)/(EI_s))^{1/4}$ where $L_s$ is the length of the coupling spring, $w_s$ is the width of the coupling spring, h is the height of the coupling spring, and ω is the frequency.

Increasing coupling beam stiffness ($k_{sij}$) increases the RF MEMS filter bandwidth. So, for a given bandwidth, increasing $k_{sij}$ must be accompanied by corresponding increase in $k_r$. Such an increase in $k_r$ must be accompanied by a corresponding increase in μresonator mass $m_r$ to maintain the desired RF filter center frequency. Thus, to maximize attainable RF MEMS filter bandwidth flexibility and so, selectability μresonator stiffness $k_r$ and μresonator mass $m_r$ must be scalable simultaneously, preferably, without drastically changing the filter's overall dimensions.

Generally, the effective dynamic stiffness and mass of a μresonator depends upon coupling position on the μresonator. Different locations along a vibrating μresonator move with different velocities and conversely provide different resistance to movement. So, the μresonator presents an effective dynamic mass ($m_r$) and stiffness ($k_{rc}$) to a coupling beam that are a function of the coupling location. Coupling at location c on a μresonator presents a dynamic mass ($m_{rc}$) and stiffness ($k_{rc}$) with the form:

$$k_{rc} = \omega_o^2 m_{rc}$$

$$m_{rc} = \frac{KE_{tot}}{(1/2)v_c^2}$$

where $KE_{tot}$ is the kinetic energy, $\omega_o$ is radian resonant frequency and $v_c$ is the magnitude of the resonant velocity at location c. So, for the example of FIGS. 14–15, the coupling spring encounters the least stiffness to the coupling beam at the middle of the flexible beam, i.e., where the vibrational displacement is a maximum. Conversely, coupling μresonators at either end, closer to the beam anchor points and, where velocity is much smaller, presents much larger dynamic stiffnesses to their respective coupling beams. So, forming a spring coupling at μresonator ends rather than its midpoint provides much smaller bandwidth filter for the same coupling beam stiffnesses. Dynamic stiffness ($k_r$) and mass ($m_r$) may be described as a function of distance y from anchor point:

$$k_r(y) = \omega_o^2 m_r(y)$$

$$m_r(y) = \frac{\rho W_r h \int [X(y')]^2 dy'}{[X(y)]^2}$$

where X(y)=(cos(ky)−cos h(ky))−$\sigma_n$(sin(ky)−sin h(ky)), ρ is the density of the structure material, k=4.73/$L_r$ and $\sigma_n$=0.9825 for the fundamental mode.

FIG. 17 shows an example of a flow diagram of a preferred embodiment method 300 for integrally forming MEMS structures in an IC chip that may include the above-described μresonator as well as an electrical actuator that may be a tunable capacitor or a μswitch. The method 300 is substantially similar to the above-described method 100 of FIG. 2 with identical steps labeled identically. No additional description is provided for identical steps and reference is made to their description above with respect to FIG. 2.

First, in step 102 electrical circuit elements are formed. In step 104 the intermetal dielectric pattern to form partial cavities. In step 302, which corresponds to step 106 of FIG. 2, the silicon is etched from beneath the flexible beam 132 and, simultaneously, surface pockets are formed in the surface of the intermetal dielectric layer. In step 304 first (bottom) electrodes are formed on the floor of the pockets. Next, in step 306 photoresist is deposited to fill the cavities and patterned, substantially identically as in step 108 and, in addition, to fill the surface pockets. The patterned photoresist extends slightly above the intermetal dielectric layer surface and slightly beyond the perimeter of the cavities and pockets. Then, in step 308 a first capping layer is formed over the wafer and patterned to extend slightly beyond the perimeter of the photoresist in the cavities and pockets and to expose portions of selected pockets, i.e., those pockets intended as μswitch locations. In step 310 top level electrodes (actuators and sense electrodes) are formed over the pockets and separated from the bottom electrodes at least by the photoresist. Actuator electrodes are formed on the first dielectric layer. Switch sense electrodes are formed on the pocket photoresist, otherwise sense electrodes are formed on the first dielectric layer. In step 312 a second dielectric layer is formed over the first dielectric layer and patterned. The patterned second dielectric covers top electrodes disposed over the pockets and any exposed photoresist and covers the first dielectric layer over the cavities.

Next, in step 112 as described above the capping layer (both the first and second dielectric layers in this embodiment) is patterned to open photoresist cleanout openings and the photoresist is removed from the MEMS cavities and pockets. In step 114 a tantalum layer is deposited in a vacuum to plug the cleanout openings and to maintain a vacuum inside the capped cavities and pockets. Thus, in this embodiment, in addition forming μresonator as described above with reference to FIGS. 3A–H, MEMS actuators have been formed, simultaneously and integrally with the same structure.

FIGS. 18A–G show the steps of FIG. 17 of forming MEMS actuators simultaneously with forming μresonators integrally with active devices, such as transistors. As with FIG. 17, identical elements to those shown in FIGS. 3A–H (i.e., FET elements and μresonators 148) are labeled identically and no additional description is provided. So, in step 302 as shown in FIG. 18A, for this example two pockets 340, 342 are formed in the upper surface 344 of the intermetal dielectric layer 122 simultaneously with etching substrate silicon 120 to form cavities 140. Next, in step 304 bottom electrodes 346, 348 are formed in the pockets 340, 342, respectively. Then, in step 306 as shown in FIG. 18B, the cavities 140 and the pockets 340, 342 are filled with photoresist 350, 352, respectively. In step 308, first dielectric or capping layer 354 is deposited and patterned. In this example, the cavities 140 and pocket 340 are capped completely and pocket 342 is capped selectively, at least exposing photoresist in gap 358 immediately over bottom μswitch sense electrode in pocket 342. It should be noted that in this example only portions 356 of the first dielectric layer 354 remain on the photoresist 352 in pocket 342. However, for this μswitch structure it is only necessary to remove the first dielectric layer over bottom μswitch sense electrode. Thus, portions 358 may extend horizontally out from center gap 356 to just beyond the perimeter of photo resist 352.

Continuing in step 310 as shown in FIG. 18D, top drive electrodes 360 and top sense electrode 362 are all formed on the first dielectric layer 354 over photo resist 350, 352 in pockets 340, 342. Top μswitch sense electrode 362 is formed directly on photoresist 352 such that when photoresist 352 is removed to form a μswitch in pocket 342, top sense electrode 364 may be forced down to contact bottom electrode 348 thereby completing a circuit, i.e., closing the μswitch. Next, in step 312 as shown in FIG. 18E, a second capping layer 366 is formed on the wafer and patterned such that caps remain on the photoresist in cavities 140 and in pockets 340, 342. Also, in this patterning step 312, photoresist cleanout openings 144, 368 are opened through the dielectric caps.

In step 112 is shown in FIG. 18F, photoresist is removed from all cavities 140 and all pockets 340, 342 through the cleanout openings 144, 368. Finally, in step 114 as shown in FIG. 18G, tantalum is deposited in a vacuum and patterned to plug the cleanout openings 144, 368. As described above the tantalum 370 plugs the cleanout openings 144, 368, sealing the cavities 140 and pockets 340, 342 in a vacuum, thereby ameliorating the damping effects of any gas that might otherwise be trapped therein. Further, the tantalum acts as a getter as described above, removing any remaining gas that might have otherwise been trapped in the pockets 340, 342 or the cavity 140. Optionally (not shown), a substantially larger area of tantalum may remain, essentially, covering the capped MEMS structures, 148, 370, 372. So, FIG. 18G shows a cross sectional example of a completed integrated circuit chip that includes transistors (e.g. FETs), a μresonator 146 a tunable capacitor 370 and a μswitch 372.

FIGS. 19A–B shows an example of using an electrostatic capacitive MEMS 370 as tunable capacitor as described hereinabove. Further, a μswitch 372 operates substantially similarly to the tunable capacitor 370. Micromechanical Switches 372 are an important passive component (actuator) for a wireless communications network, a transmit/receive (T/R) selection, phaseshifter control, switchable filter selection, cross-bar/multiplexing tuning tunable antennas and controlling phased arrays. This embodiment of the present invention may be used also for tuning tunable capacitors (varactors) 370 or used, essentially, whenever circuit tunability is required (e.g., in variable matching circuits and voltage controlled oscillators), rapidly switching components in and out as desired.

As described hereinabove, applying a voltage between two top metal electrodes 360 (actuators) and bottom metal electrodes 346 generate a force that causes the capping dielectric to deform, changing the separation space between top metal sense electrodes 362 and bottom metal reference electrode 348. So, varying voltages across the electrostatic actuators 360, varies the separation between the top sense electrode 362 and bottom reference electrode 348 of the tunable capacitor 370, which causes the capacitance therebetween to vary inversely. As shown in FIG. 19A, when the electrostatic actuators 360 underlying reference electrodes 346 are at the same voltage potential, the capacitance of the tunable capacitor 370 is a minimum. In FIG. 19B, when a voltage difference is applied between the electrostatic actuators 360 and the bottom electrodes 346, the separation between the plates 348, 362 of the tunable capacitor 370 is changed. A large enough voltage minimizes the separation (closes the gap) to maximize the capacitance of the tunable capacitor 370.

Thus, with the underlying first dielectric layer 365, a tunable capacitor 370 is formed in pocket 340 and substantially the same structure in pocket 342, without the underlying first dielectric layer under the sense electrode 362 is a micromechanical switch 372. With no potential difference across the actuator electrodes the micromechanical switch 372 is open. With maximum voltage applied across the actuator electrodes 346, 360 the μswitch 372 closes.

FIG. 20A shows a cross-section and FIG. 20B shows a plan view of an example of a high-Q microinductor 380. High-Q inductors are passive components that are necessary for impedance matching networks, low noise amplifiers, and voltage controlled oscillators. Numerous high-Q pinductors have been fabricated using, EDP based, KOH based or reactive ion etching (DRIE) substrate removal strategies to form μinductors of about 115 nH with Qs of about 22 at 270 MHz.

Thus, using typical CMOS processing steps, RF MEMS μresonators of the resent invention may be integrated with typical circuits and memory onto a single chip to form a wireless communications network on a chip. Such an integrated wireless communications network on a chip is a low-cost, small-form-factor, high-performance wireless communications system. So, for the circuit of FIG. 1, for example, the ceramic filter 54, SAW IF filter 62, crystal oscillator 70 and crystal IF filter 72 may all be replaced with preferred embodiment μresonators, thereby allowing integration of the entire circuit 50 on a single chip. Containing this identical circuit 50 on a single IC greatly enhances the SNR of the receiver circuit 50 and optimizes its system-level performance.

Also, as described hereinabove, other capacitive MEMS sensors and electrostatic MEMS actuators may be included on the same chip, allowing inclusion of these RF MEMS components with other electrical circuits such as a CPU, memory, a MEMS sensor array or a MEMS actuator array, for example, and interconnected to a non-chip wireless communications system bus.

Advantageously, the present invention has a broad range of IC uses such as in circuits for global positioning system (GPS) receivers, wireless data links such as "Bluetooth", IEEE 802. 11b and HomeRF, as well as other wireless system applications. The reduced size and power consumption of preferred embodiment RF MEMS filters allows for the inclusion of hundreds of such filters onto a single chip.

These RF MEMS filters and switches may be configured to provide a single chip massively parallel bank of switchable filters, from which a large number of different wireless frequency bands may be selected for use in GSM, CDMA, TDMA, Bluetooth, HomeRF applications for example. Exploiting the switching flexibility of such a system, facilitates integration of single chip very resilient, frequency-hopping spread spectrum transceiver architectures that provide simultaneous switching of high-Q RF MEMS filters and oscillators. Furthermore, MEMS structures according to the preferred embodiment are small enough to not require shielding, i.e., they are virtually shielded.

FIG. 21 shows an example of a preferred embodiment MEMS structure 400, e.g., microresonator 148 of FIGS. 3A–H modeled as a center fed linear antenna. The driver element of the RF MEMS structure corresponds to the antenna elements 402, 404 fed by signal source 406. The total length of the trace elements 402 and 404, e.g., 152 of FIG. 4A has length d. It should remembered that reciprocity for electromagnetic radiation states that the radiation pattern of an antenna is the same whether it is receiving or transmitting. Therefore, calculating the radiation power of the RF MEMS structure 400 also calculates its absorption power. Thus, the antenna power, whether radiation or absorption is defined by:

$$P = I^2 (2\pi d/\lambda)^2 /[12c]$$

where I is the current used to produce the radiation, $\lambda$ is the wavelength of the emitted/absorbed radiation, and c is the speed of light in the vacuum ($3.0 \times 10^8$ m/s). A 2 GHz signal in a vacuum, which is at the high end of the wireless frequencies, has a wavelength $\lambda$ of 15 cm. The average length of a trace for the RF MEMS structure 400 is <10 μm (i.e., d<10 μm). For a typical maximum current flowing in a CMOS sense/drive circuits I=1 mA. So, using these values, a signal having $<10^{-22}$ W, e.g., $P=4.9\times10^{-23}$ W, is coupled into/out of the RF MEMS structures. This coupled power is insignificant and generates a noise signal that at most is 1picoV, i.e., it is 9 to 6 orders of magnitude below the signal produced by the RF MEMS resonators at resonant frequency, and, therefore, 120 dB<SNR<180 dB.

Thus, the MEMS structure of the preferred embodiment of the present invention is impervious to noise and generates essentially no RF noise itself. Accordingly, by virtue of its size, the preferred embodiment MEMS structure is virtually shielded from external RF noise and safe from inadvertent RF noise generation.

Accordingly, integrating sensors, actuators with processors and other circuits onto the same single chip has many advantages. Parasitics normally encountered between the electrical circuits and RF MEMS components are eliminated, thereby providing much improved signal-to-noise ratio for present invention RF MEMS component modules over prior art equivalent functions. The integrated sensors enhance signal to noise ratio because signal is not lost connecting the passive device and the integrated circuit. The laterally resonant silicon capacitance structure may be only a few femto-Farads (fF) and so, require a sense circuit that also has very low input capacitance (also a few fF) and that is capable of discerning capacitance changes at that level. Thus, placing the sensor on-chip and close to electrical sense circuits to minimize wiring and other parasitic capacitance allows using very sensitive sensing circuits without considering parasitic wiring effects to any great extent, totally avoiding any effect of high input capacitance from transmission cables and subsequent connected instrumentation. Thus, greater system-level sensitivity is achieved for the wireless communications network. Clearly, the response, sensitivity and resolution of preferred embodiment microsensors have a large advantage over prior sensor approaches.

In addition, integrating the sensors onto the same chip with circuits using sensor signals enhances circuit functionality, size and weight and at a much lower cost than comparable approaches. For example, placing all components of a wireless communications network on a single chip greatly enhances its system level performance, reduces its final cost, power consumption, and size. Further, system level component count is reduced dramatically (electrical circuits, oscillators, filters, sensors, and actuators are on the same substrate) to simplify the packaging requirements and eliminate interconnects between network components that are part of the same integrated circuit. In addition, the power consumption of the single RF MEMS chip is significantly less than a collection of prior art corresponding individual high-Q, passive component parts.

While the invention has been described in terms of preferred embodiments, those skilled in the art will recognize that the invention can be practiced with modification within the spirit and scope of the appended claims.

What is claimed is:

1. An electromechanical structure comprising:
    a flexible beam integrally formed in a cavity in a surface of a semiconductor body, said flexible beam attached at both ends to sidewalls of said cavity;
    a conductive plate in said flexible beam, extending lengthwise along said flexible beam;
    a second conductive plate parallel to said first conductive plate and extending along a sidewall of said cavity; and
    a voltage being applied across said first conductive plate and second conductive plate, said flexible beam being forced horizontally with said surface and substantially parallel to said second conductive plate responsive to said voltage, whereby an oscillating voltage applied across said first and second plate causes said flexible beam to vibrate horizontally.

2. An electromechanical structure as in claim 1 further comprising a third conductive plate on an opposite side of said flexible beam, capacitance between said first conductive plate and said third conductive plate being varied responsive to horizontal movement of said flexible beam.

3. An electromechanical structure as in claim 2 wherein said cavity is formed in a dielectric layer disposed on a silicon layer, said silicon layer further comprising a plurality of transistors, selected ones of said plurality of transistors providing said alternating voltage across said first conductive plate and said second conductive plate and other ones of said transistors receiving a signal from said varied capacitance, said signal reflecting resonant frequency oscillation.

4. An electromechanical structure as in claim 3 wherein said transistors are field effect transistors (FETs).

5. An electromechanical structure as in claim 1 wherein said flexible beam is a first flexible beam, said electromechanical structure further comprising:
    a second flexible beam integrally formed in said cavity with both ends attached to sidewalls of said cavity;
    a spring member attached between said first flexible beam and said second flexible beam, said spring member applying a coupling force from said first flexible beam to said second flexible beam;
    a third conductive plate in said second flexible beam extending lengthwise along said second flexible beam; and a fourth conductive plate parallel to said second conductive plate and extending along another sidewall of said cavity.

6. An electromechanical structure as in claim 5 wherein capacitance between said third conductive plate and said fourth conductive plate is varied responsive to horizontal movement of said first flexible beam.

7. An electromechanical structure as in claim 6 wherein said cavity is formed in a dielectric layer disposed on a silicon layer, said silicon layer further comprising a plurality of transistors, selected ones of said plurality of transistors providing said alternating voltage across said first conductive plate and said second conductive plate and other ones of said transistors receiving a signal from said varied capacitance, said signal reflecting resonant frequency oscillation.

8. An electromechanical structure as in claim 6 wherein the spring element is attached at the midpoint of each of said first flexible beam and said second flexible beam.

9. An electromechanical structure as in claim 6 wherein said spring element is attached closer to one end of each of said first flexible beam and second flexible beam than to the other end.

10. An electromechanical structure as in claim 6 wherein said transistors are field effect transistors (FETs).

11. An electromechanical structure comprising:
a flexible beam integrally formed in a cavity in a surface of a semiconductor body, said flexible beam attached at both ends to sidewalls of said cavity;
a conductive plate in said flexible beam, extending lengthwise along said flexible beam;
a second conductive plate parallel to said first conductive plate and extending along a sidewall of said cavity;
a voltage being applied across said first conductive plate and second conductive plate; and
a cap layer sealing said cavity, whereby a vacuum is maintained in said cavity.

12. An electromechanical structure as in claim 11 further comprising a third conductive plate on an opposite side of said flexible beam, capacitance between said first conductive plate and said third conductive plate being varied responsive to horizontal movement of said flexible beam.

13. An electromechanical structure as in claim 12 formed in a dielectric layer disposed on a silicon layer, said silicon layer further comprising a plurality of transistors, selected ones of said plurality of transistors providing said alternating voltage across said first conductive plate and said second conductive plate and other ones of said transistors receiving a signal from said varied capacitance, said signal reflecting resonant frequency oscillation.

14. An electromechanical structure as in claim 13 wherein said transistors are field effect transistors (FETs).

15. An electromechanical structure as in claim 11 wherein a vacuum below $10^{-6}$ torr is maintained in said cavity.

16. An electromechanical structure as in claim 15 wherein said cap layer further comprises at least one plug of getter material, said getter material plug removing any gas from said cavity further maintaining said vacuum in said cavity.

17. An electromechanical structure as in claim 11 wherein said flexible beam is a first flexible beam, said electromechanical structure further comprising:
a second flexible beam integrally formed in said cavity with both ends attached to sidewalls of said cavity;
a spring member attached between said first flexible beam and said second flexible beam, said spring member applying a coupling force from said first flexible beam to said second flexible beam;
a third conductive plate in said second flexible beam extending lengthwise along said second flexible beam; and
a fourth conductive plate parallel to said second conductive plate and extending along another sidewall of said cavity.

18. An electromechanical structure as in claim 17 wherein capacitance between said third conductive plate and said fourth conductive plate is varied responsive to horizontal movement of said first flexible beam.

19. An electromechanical structure as in claim 18 wherein said cavity is formed in a dielectric layer disposed on a silicon layer, said silicon layer further comprising a plurality of transistors, selected ones of said plurality of transistors providing said alternating voltage across said first conductive plate and said second conductive plate and other ones of said transistors receiving a signal from said varied capacitance, said signal reflecting resonant frequency oscillation.

20. An electromechanical structure as in claim 19 wherein the spring element is attached at the midpoint of each of said first flexible beam and said second flexible beam.

21. An electromechanical structure as in claim 19 wherein said spring element is attached closer to one end of each of said first flexible beam and second flexible beam than to the other end.

22. An electromechanical structure as in claim 19 wherein said transistors are field effect transistors.

23. A microelectromechanical (MEMS) resonator formed in a surface of a semiconductor body, said MEMS resonator being virtually shielded and comprising:
a flexible beam integrally formed in a cavity in the surface of a semiconductor body, said flexible beam attached at both ends to sidewalls of said cavity;
a conductive plate in said flexible beam and extending lengthwise along said flexible beam;
a second conductive plate parallel to said first conductive plate and extending along a sidewall of said cavity; and
a voltage being applied across said first conductive plate and said second conductive plate, said flexible beam vibrating at radio frequency (RF) responsive to said voltage, wires providing said voltage to said MEMS resonator and providing any signal from said MEMS resonator having a length in combination with said MEMS resonator shorter than the wavelength of the RF from said MEMS resonator,
whereby said flexible beam is insensitive to RF radiation and does not radiate RF energy.

24. A MEMS resonator as in claim 23 further comprising a third conductive plate on an opposite side of said flexible beam, capacitance between said first conductive plate and said third conductive plate being varied responsive to horizontal movement of said flexible beam.

25. A MEMS resonator as in claim 24 wherein said cavity is formed in a dielectric layer disposed on a silicon layer, said silicon layer further comprising a plurality of transistors, selected ones of said plurality of transistors providing said alternating voltage across said first conductive plate and said second conductive plate and other ones of said transistors receiving a signal from said varied capacitance, said signal reflecting resonant frequency oscillation.

26. A MEMS resonator as in claim 25 wherein said transistors are field effect transistors.

27. A MEMS resonator as in claim 23 wherein said flexible beam is a first flexible beam, said electromechanical structure further comprising:

a second flexible beam integrally formed in said cavity with both ends attached to sidewalls of said cavity;

a spring member attached between said first flexible beam and said second flexible beam, said spring member applying a coupling force from said first flexible beam to said second flexible beam;

a third conductive plate in said second flexible beam extending lengthwise along said second flexible beam; and a fourth conductive plate parallel to said second conductive plate and extending along another sidewall of said cavity.

28. A MEMS resonator as in claim 27 wherein capacitance between said third conductive plate and said fourth conductive plate is varied responsive to horizontal movement of said first flexible beam.

29. A MEMS resonator as in claim 28 wherein said cavity is formed in a dielectric layer disposed on a silicon layer, said silicon layer further comprising a plurality of transistors, selected ones of said plurality of transistors providing said alternating voltage across said first conductive plate and said second conductive plate and other ones of said transistors receiving a signal from said varied capacitance, said signal reflecting resonant frequency oscillation.

30. A MEMS resonator as in claim 29 wherein the spring element is attached at the midpoint of each of said first flexible beam and said second flexible beam.

31. A MEMS resonator as in claim 29 wherein said spring element is attached closer to one end of each of said first flexible beam and second flexible beam than to the other end.

32. A MEMS resonator as in claim 29 wherein said transistors are field effect transistors.

* * * * *